(12) United States Patent
Otake et al.

(10) Patent No.: US 6,600,181 B2
(45) Date of Patent: Jul. 29, 2003

(54) SEMICONDUCTOR INTEGRATED CIRCUIT AND DESIGNING METHOD THEREOF

(75) Inventors: Shigenori Otake, Higashimurayama (JP); Goichi Yokomizo, Hinode (JP); Shiro Kamohara, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/883,318

(22) Filed: Jun. 19, 2001

(65) Prior Publication Data

US 2002/0011606 A1 Jan. 31, 2002

(30) Foreign Application Priority Data

Jun. 21, 2000 (JP) ........................................ 2000-185660

(51) Int. Cl.[7] ........................ H01L 29/80; H01L 31/112
(52) U.S. Cl. ........................................ 257/277; 257/531
(58) Field of Search ........................ 257/277, 312, 257/531, 532, 777, 778

(56) References Cited

U.S. PATENT DOCUMENTS 4,334,324 A * 6/1982 Hoover ........................ 455/333
4,743,789 A * 5/1988 Puskas ........................ 310/316
5,521,783 A * 5/1996 Wolfe et al. .................. 361/56
5,598,327 A * 1/1997 Somerville et al. ......... 363/131

FOREIGN PATENT DOCUMENTS

| JP | 2-250371 | 10/1990 |
|---|---|---|
| JP | 6-309050 | 11/1994 |
| JP | 8-288462 | 11/1996 |

* cited by examiner

Primary Examiner—David Nelms
Assistant Examiner—David Nhu
(74) Attorney, Agent, or Firm—Mattingly, Stanger & Malur, P.C.

(57) ABSTRACT

A semiconductor integrated circuit has a semiconductor internal circuit having a first power supply line and a second power supply line, wiring layers connected to a plurality of terminals of a first power supply and each having a predetermined inductance, and wiring layers connected to a plurality of terminals of a second power supply and each having a smaller inductance. Each of the former wiring layers has an inductor making a loop around the internal circuit.

9 Claims, 22 Drawing Sheets

SEMICONDUCTOR INTEGRATED CIRCUIT AND DESIGNING METHOD THEREOF

BACKGROUND OF THE INVENTION

1. Field of the Invention

The present invention relates to a technique for reducing the source current noise in a semiconductor integrated circuit and further relates to a decoupling circuit formed on a semiconductor chip as well as a technique effectively utilized for a method of determining an inductance of an inductor constituting the decoupling circuit.

2. Description of the Related Art

In a system using the semiconductor integrated circuit (hereinafter referred to as an LSI), a high frequency component of a change of current in the LSI generates an electromagnetic wave as well known in the art. The following techniques for suppression of electromagnetic radiation have been known. More particularly, the specification of JP-A-6-309050 discloses a semiconductor substrate 12 of the semiconductor device 10 having a constant current source element 24 interposed in a source voltage supply line 26 supplying a source voltage to the internal circuit 22 and a capacity means 30 connected to a ground voltage supply line 28 supplying a ground voltage to the internal circuit 22 and the source voltage supply line 26. Also, the specification of JP-A-8-288462 discloses a semiconductor integrated circuit device having a circuit grout 5, which includes a CPU 5, a bus 8, which is provided so as to surround the circuit group 5, and a terminal pad 9 which is arranged outside the bus 8, wherein the semiconductor integrated circuit device is also provided with constant potential lines 1a and 3a, which have a part routed to increase the parasitic inductance and reach the circuit group 5 from the constant potential terminal pads 2 and 4. Further, the specification of JP-A-2-25037 discloses that an inductance component 5 and a resistance component 5R are added to an LSI 1 for increasing voltage drop inside the LSI 1, wherein, since the voltage drop inside the LSI increases, the voltage drop outside the LSI is relatively decreased, reducing the noise level outside the LSI.

The technique for providing a decoupling circuit comprised of an inductor and a bypass capacitor on a printed circuit board faces a problem that the number of parts packaged in the printed circuit board increases to reduce the packaging density and increase costs of fabrication.

Further, the technique in which a constant current element is provided for a source voltage supply line on a semiconductor chip and a capacity means is connected between a source voltage line and a ground line has a disadvantage that the substantial source voltage level in the internal circuit is decreased by the constant current element on the source voltage supply line.

Furthermore, in the technique in which a fixed potential line, that is, source voltage line and a ground potential line are pulled about on a chip to increase a parasitic inductance component so as to suppress a change in source voltage, the ability of response to signals is degraded to make this technique undesirable. Also, in the technique of increasing inductance and resistance components by pulling about the source wiring in the LSI, the internal load or the source impedance increases, having a disadvantage that the change of source voltage in the internal circuit increases.

SUMMARY OF THE INVENTION

An object of the invention is to provide a semiconductor integrated circuit that can decrease the adverse influence upon the operation of the internal circuit and effectively prevent a high frequency component of source current change from generating an electromagnetic wave.

Another object of the invention is to provide a design technique that can easily determine an inductance of a source inductor and a source capacitance necessary for suppressing the source current noise to a desired value or less through simulation in designing the semiconductor integrated circuit.

The above and other objects and novel features of the present invention will become apparent from a description of the present specification taken in conjunction with the accompanying drawings.

Representative ones of inventions disclosed in the present application will be outlined as below.

Namely, according to one aspect of the present invention, in an LSI having a plurality of power supply pads and a plurality of ground potential pads, wiring conductors having impedances which are substantially equal to each other are provided between the plurality of power supply pads and a power supply line in the LSI.

More specifically, there are provided a plurality of first power supply pads, a plurality of second power supply pads, a first power supply line for supplying a first power supply voltage applied to the plurality of first power supply pads to an internal circuit, a second power supply line for supplying a second power supply voltage applied to the plurality of second power supply pads to the internal circuit, and a plurality of inductors each connected between each of the plurality of first power supply pads and the first power supply line and each being comprised of a wiring conductor in the form of a horse shoe, a U-shape, a frame shape, a spiral or a loop that makes a loop around the internal circuit by ¾ turns or more so as to make the plurality of inductors may have mutually substantially equal impedances reaching nodes at which the internal circuit connects to the first power supply line.

With the above construction, the wiring conductors or inductors are respectively provided between the plurality of external power supply terminals and the power supply line in the semiconductor integrated circuit, whereby a change in source current passing through the inductors can be suppressed to ensure that propagation of the source current noise to the outside of the semiconductor integrated circuit can be prevented effectively to prevent the generation of an electromagnetic wave due to a high frequency component of the source current noise. Further, since any wiring conductors or inductors are not pulled about between the plurality of external ground terminals and the ground line in the LSI, the ability of response to signals is not degraded. In addition, the plurality of inductors respectively connected to the plurality of external power supply terminals can increase the source inductance in total. Further, the plurality of inductors connected in parallel can decrease the source impedance relative to the internal circuit.

Preferably, the wiring conductors constituting the plurality of inductors may each be formed so as to make a loop around the semiconductor chip and so as to be connected between the corresponding power supply pad and the first power supply line so that the direction of current flowing through each wiring conductor may be the same. This is because the parallel arrangement of a plurality of lines in which currents flow in opposite directions decreases the inductance. An inductor of a desired inductance can be formed without increasing the chip size to a substantially large extent in comparison with the conventional semiconductor integrated circuit devoid of inductor.

More preferably, each inductor may include a first wiring layer formed to make a loop around the semiconductor chip and a second wiring layer formed to overlap the first wiring layer, the start end of the first wiring layer may be connected to any one of the plurality of first power supply pads and the termination end of the first wiring layer may be connected to the start end of the second wiring layer, and the termination end of the second wiring layer is connected to the first power supply line. In other words, the inductor takes the form of a double coil comprised of mutually overlapping upper and lower two wiring layers. Through this, the inductance can be increased without increasing the occupation area of the internal circuit.

Preferably, each inductor may include a first wiring layer formed to make a loop around the semiconductor chip and a second wiring layer formed to overlap the first wiring layer, and the first wiring layer may be connected to the second wiring layer through a low impedance by way of through-holes formed in an insulating film for separating the first and second wiring layers. In other words, the inductor takes the form of a double coil comprised of mutually overlapping upper and lower two wiring layers that are connected by way of the through-holes formed in the insulating film. Through this, the resistance component of the inductor can be reduced without increasing the occupation area to sufficiently assure the source voltage of the internal circuit.

Preferably, the wiring layer constituting each inductor may be formed to make a loop around an area in which the internal circuit of the semiconductor chip is formed. With this construction, the wiring layer constituting the inductor can be formed of the wiring layer constituting the power supply line of the internal circuit and the signal line to ensure that the inductor can be formed without complicating the process.

Further, the wiring layer constituting each inductor may preferably be formed into a U-shape, a frame shape, a spiral or a loop shape that makes a loop around an area approximately equal to or slightly smaller than the occupation area of the internal circuit above the area in which the internal circuit of the semiconductor chip is formed. With this construction, the inductance can further be increased without increasing the occupation area.

Preferably, the wiring layer constituting each inductor may take a spiral form outside the area in which the internal circuit of the semiconductor chip is formed. Through this, the wiring layer constituting the inductor can be formed of the wiring layer constituting the power supply line of the internal circuit and the signal line and the inductor can be formed without complicating the process.

Further, the first and second power supply lines may preferably be formed in a mesh or net pattern over the whole area in which the internal circuit of the semiconductor chip is formed. With this construction, the resistance of the first and second power supply lines can be reduced and the source voltage of the internal circuit can be assured sufficiently.

Further, at a portion where the wiring layer constituting each inductor is parallel with the first power supply line, the wiring layer constituting the inductor or a wiring layer constituting the first power supply line may preferably be formed as one electrode of a capacitor and a conductive layer serving as the other electrode of the capacitor may be formed so as to oppose the one electrode through an insulating film, thus forming a bypass capacitor. With this construction, the bypass capacitor having a desired capacitance can be formed without increasing the chip size.

Further, a conductive layer formed separately from the conductive layers constituting the electrodes may preferably be provided to the insulating film between the one electrode and the other to decrease the distance between the one electrode and the other electrode. With this construction, a large capacitance can be obtained without increasing the area.

Further, a conductive layer formed separately from the conductive layers constituting the electrodes and formed with irregularities may preferably be provided for the insulating film between the one electrode and the other electrode so as to decreases the distance between the one electrode and the other electrode and increase the substantial opposing area. With this construction, a further larger capacitance can be obtained without increasing the area.

According to another aspect of the present invention, in determining an inductance Lchip of the source inductor and a source capacitance Cchip that are to be built in an LSI chip, when power supply wiring on the board and lead terminals and bonding wire of the LSI package have an inductance Lboard, the inductance of the source inductor and the source capacitance are so selected as to satisfy the following two inequalities:

$$\sqrt{\left(\frac{Imac(\omega)}{Imax(\omega)} \cdot \frac{VCC0}{Vchip0}\right)^2 ((\omega CchipRchip)^2 + 1) - (\omega CchipRchip)^2} + 1 - Lboard \leq Lchip \quad (1)$$

$$Imac(\omega = 0) \cdot \frac{VCC0}{Vchip0} \quad (2)$$

$$\sqrt{\frac{Lboard + Lchip}{Cchip}} \cdot \exp\left(-\frac{G}{\sqrt{4-G^2}} a\tan\left(\frac{(1-G^2)\sqrt{4-G^2}}{2G}\right)\right)$$

$$\left(\frac{2}{\sqrt{4 - 5G^2 + 6G^4 - G^6}}\right) \leq \Delta V$$

where Rchip represents source resistance, VCC represents generation voltage of the external voltage source, Vchip represents source voltage applied to the chip per se, Imac($\omega$) represents the sum of currents flowing through all current sources in the chip, Ave(Imac(t)) represents time average of Imac, Imax($\omega$) represents the maximum permissible value of source noise current at frequency ($\omega$), $\Delta V$ represents a permissible value of voltage drop level of the chip and G in inequality (4) is a variable indicated by G=Rchip/$\sqrt{\{(Lboard+Lchip)/Cchip\}}$.

The source noise current In is a current noise leaking from the LSI chip to the outside, that is, a noise as viewed when the power supply terminals of the chip are observed from the outside at the time that current is passed through the LSI chip. On the other hand, the permissible value AV of voltage drop level is a critical voltage drop level guaranteeing that the LSI does not operate erroneously by a voltage drop generated in the source voltage when the current Imac($\omega$) is passed through the chip.

With the above construction, a method for determining easily the inductance of source inductor and the capacitance of the source capacitor necessary for suppressing the source current noise to a desired value or less through simulation can be provided.

DESCRIPTION OF THE EMBODIMENTS

Preferred embodiments of the present invention will now be described with reference to the accompanying drawings.

Figure 1:
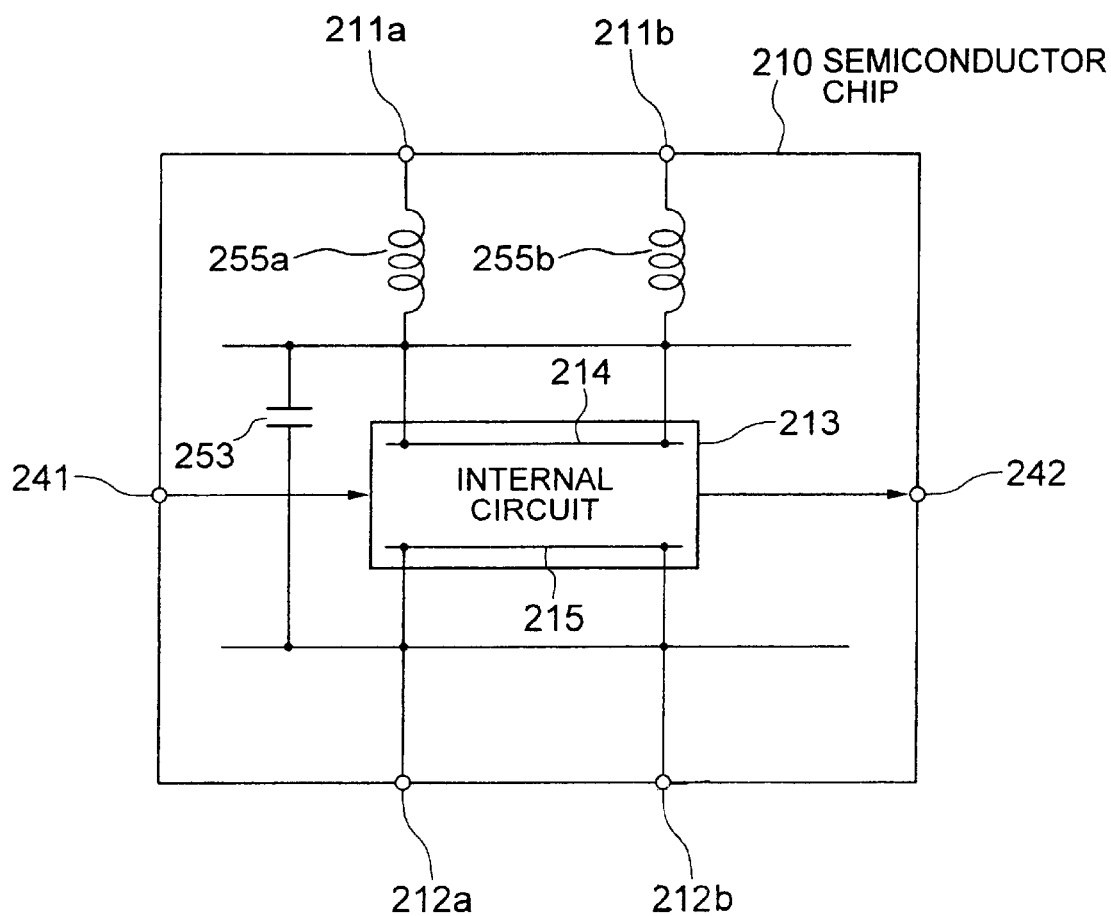
FIG. 1 is a circuit diagram showing the schematic construction of a semiconductor integrated circuit to which the invention is applied.

Referring to FIG. 1, a semiconductor integrated circuit to which the invention is applied is constructed as schematically shown therein. In FIG. 1, the semiconductor integrated circuit formed in a semiconductor chip 210 made of for example, single crystal silicon comprises power supply pads 211 (211a, 211b) provided at the peripheral portion of the chip 210, ground potential pads 212 (212a, 212b), an internal circuit 213, a power supply line 214 connected to the internal circuit, and a ground line 215 connected to the internal circuit. A plurality of power supply pads 211 and a plurality of ground potential pads 212 are provided on the chip, with an inductor 255 (255a, 255b) interposed between each of the power supply pads 211 and the power supply line 214. On the other hand, each of the ground potential pads 212 is connected directly to the ground line 215 without intervention of any inductor. A bypass capacitor 253 is interposed between the power supply line 214 and the ground line 215.

An input pad 241 is provided for signals inputted to the internal circuit 213 and an output pad 242 is provided for signals delivered out of the internal circuit 213. Two power supply pads 211 and two ground potential pads 212 are illustrated in FIG. 1 but the number of these pads is not limited to two and a desired number of pads may be provided. The number of the power supply pads 211 is not always equal to that of the ground potential pads 212. As a typical and illustrative example, the single input pad 241 and the single output pad 242 are depicted in the figure but in a practical circuit, there are provided a plurality of input pads and a plurality of output pads. A capacitor serving as bypass capacitor 253 may be added positively or intentionally to the chip but the positive addition may be omitted in case a coupling capacitance spontaneously existing between the power supply line 214 and the ground line 215 is sufficiently large.

Examples of concrete structure of the inductor 255 interposed between each of the power supply pads 211 and the power supply line 214 on the semiconductor chip will be described with reference to FIGS. 2 to 10.

Figure 2:
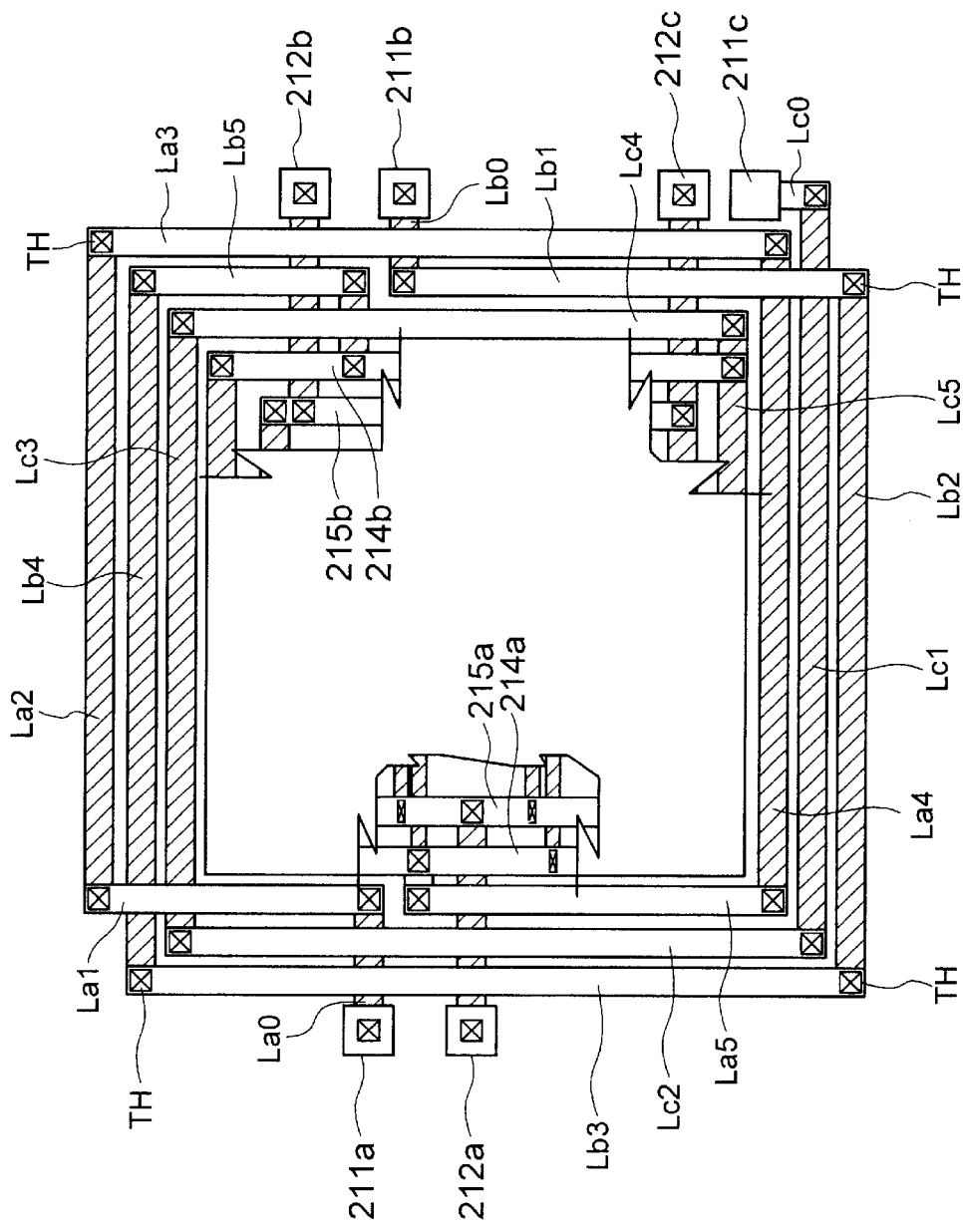
FIG. 2 is a plan view showing an example (first embodiment) of concrete construction of an inductor interposed between power supply pads and a power supply line.

Referring first to FIG. 2, three power supply bonding pads 211a, 211b and 211c are provided on the periphery of the chip. An inductor comprised of wiring layer conductors La1 to La5 and making a loop around the chip by substantially one turn is connected to a power supply pad 211a via an outgoing line La0. Of the wiring layer conductors as above, the wiring layer conductors La1, La3 and La5 that are in a given direction in FIG. 2 are formed of a single wiring layer and the outgoing line La0 and as well as the wiring layer conductors La2 and La4 that are in another direction intersecting the given direction at an angle are formed of another wiring layer. Similarly, an inductor comprised of wiring layers conductors Lb1 to Lb5 and making a loop around the chip by substantially one turn is connected to a power supply pad 211b via an outgoing line Lb0 and an inductor comprised of wiring layers Lc1 to Lc5 and making a loop around the chip by substantially one turn is connected to a power supply pad 211c via an outgoing line Lc0. Besides, the wiring layer conductors constituting these inductors are so formed as to have a relatively wide width for the purpose of suppressing their impedance. Instead of widening the width, their thickness may be increased to increase a cross-sectional area of the wiring layer conductor.

Termination ends of the wiring layer conductors La5, Lb5 and Lc5 constituting the respective inductors are connected to the power supply line 214 (214a, 214b ...) of the internal circuit. Thus, in the embodiment of FIG. 2, the length is the same between each of the power supply pads 211a, 211b and 211c and the power supply line 214 of the internal circuit to make the inductors connected to the respective pads have the substantially same inductance and in addition, the power supply pads are connected to the wiring layer conductors constituting the inductors in such a manner that currents from the individual power supply pads flow centrally of the chip 210 in substantially the same directions.

Figure 3:
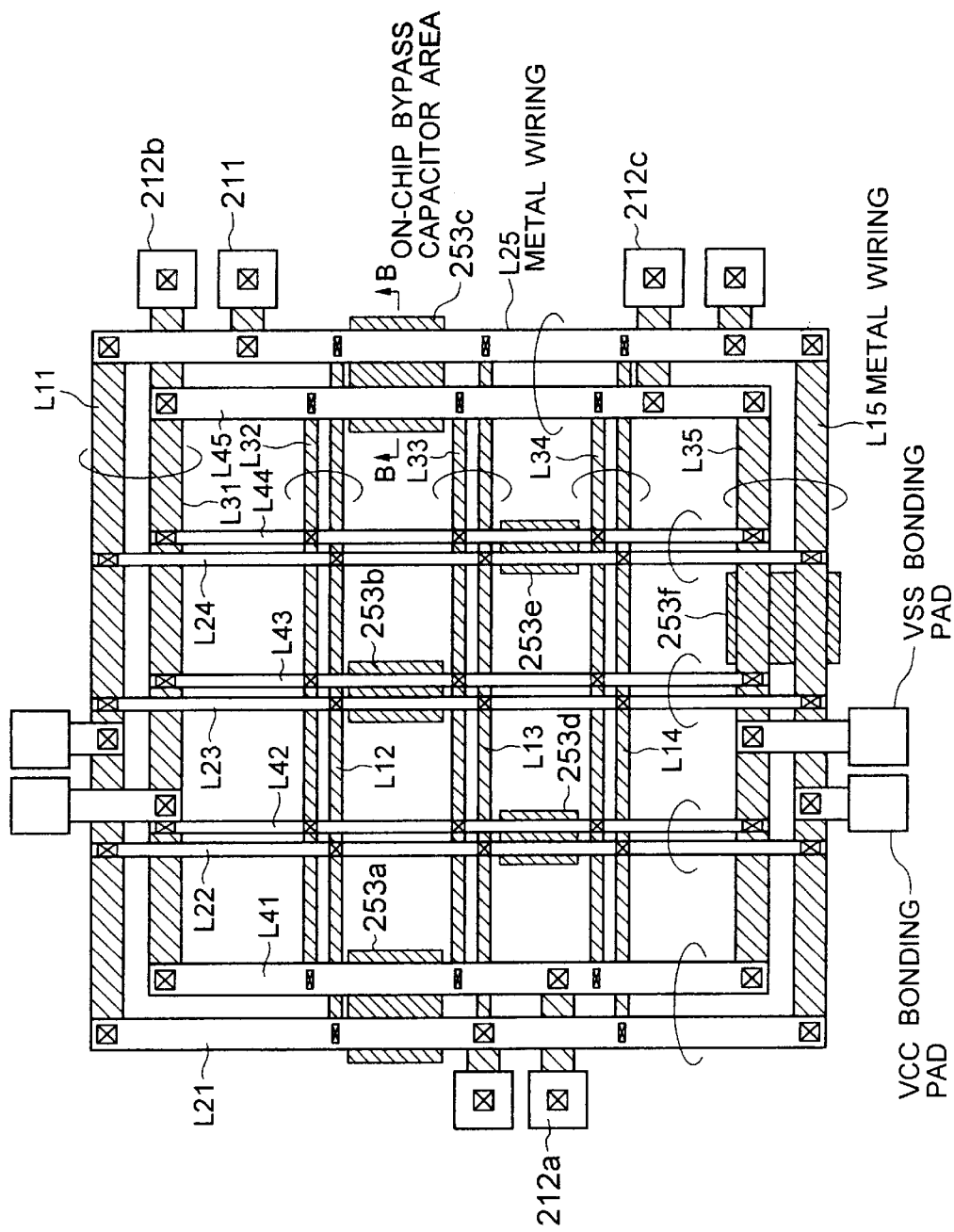
FIG. 3 is a plan view showing an example of concrete construction of the power supply line and ground line for supplying electric power to an internal circuit.

Turning to FIG. 3, in the power supply line 214 of internal circuit connected to the termination ends of the wiring layer conductors La5, Lb5 and Lc5 constituting the individual inductors, wiring layer conductors L11, L12, L13, L14 and L15 formed of a single wiring layer in a given direction and wiring layer conductors L21, L22, L23, L24 and L25 formed of a single wiring layer in another direction are put together in a mesh pattern so that power supply wiring resistances to the internal circuit on the chip may be distributed as uniformly as possible.

On the other hand, the second power supply pads or ground potential pads 212 are provided by three lime the power supply pads 211 as shown in FIG. 2 but ground potential pads 212a, 212b and 212c are connected directly to wiring layer conductors (215a, 215b ...) constituting the ground line 215 of the internal circuit. As shown in FIG. 3, in the ground line 215 of the internal circuit, wiring layer conductors L31, L32, L33, L34 and L35 in a given direction and wiring layer conductors L41, L42, L43, L44 and L45 in another direction are put together in a mesh pattern similarly to the power supply line 214 of the internal circuit.

Further, capacitor areas 253a, 253b, 253c, 253d, 253e and 253f constituting the bypass capacitor are provided at suitable sites of portions of the power supply line 214 and ground line 215 where these portions are parallel to each other. In addition to the capacitor areas 253a, 253b, 253c, 253d, 253e and 253f, capacitors constituting the bypass capacitor are also formed at sites where the wiring layer conductor constituting the power supply line 214 crosses the wiring layer conductor constituting the ground line 215.

Figure 4:
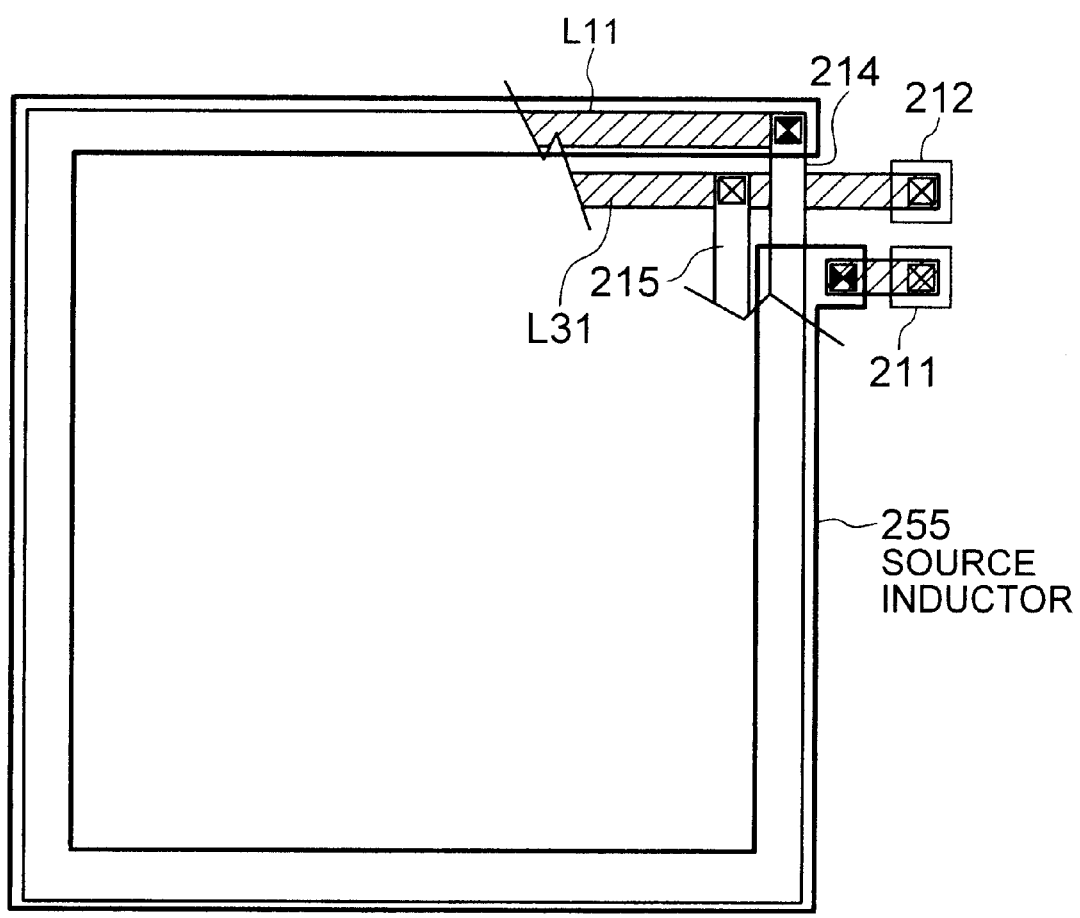
FIG. 4 is a plan view showing another example (second embodiment) of construction of the inductor interposed between the power supply pads and the power supply line.

Referring to FIG. 4, there is illustrated a second embodiment of the power supply inductor 255. In the embodiment of FIG. 2, wiring layer conductors constituting the power supply inductor are formed outside the loop of power supply line 214 of the internal circuit, thus giving rise to a disadvantage that the chip size becomes slightly larger than the conventional LSI. Accordingly, in the second embodiment, the power supply inductor 255 is insulated from the mesh patterned power supply line 214 of the internal circuit to overlie and overlap the power supply line 214 as shown in FIG. 4.

Further, in the embodiment of FIG. 2, the resistance is increased by that of through-holes TH for inter-layer connection of the two-layer power supply inductor 255 (for example, layer conductors La1 and La2). In the second embodiment, however, the power supply inductor 255 can be formed of a single wiring layer to dispense with the through-holes, thus having an advantage that the resistance can be reduced correspondingly as compared to the embodiment of FIG. 2. For simplicity of illustration, only one power supply pad 211 and a wiring layer constituting the power supply inductor 255 connected to the power supply pad 211 are depicted in FIG. 4 but like FIG. 2, a plurality of power supply pads and power supply inductors connected thereto are provided.

Figure 5:
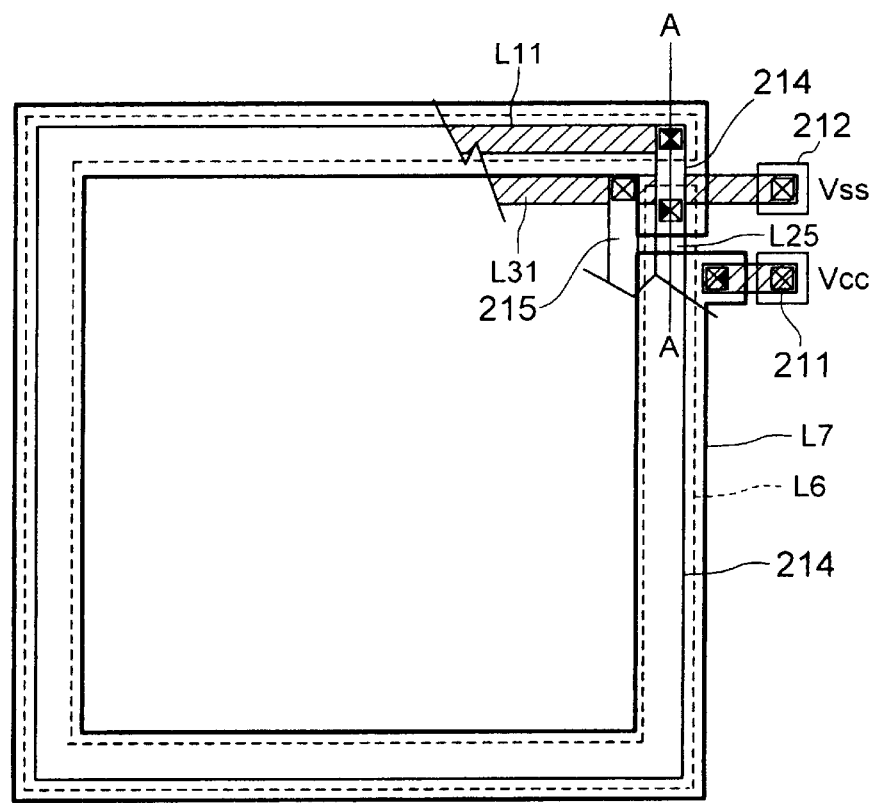
FIG. 5 is a plan view showing a third embodiment of the source inductor.
Figure 6:
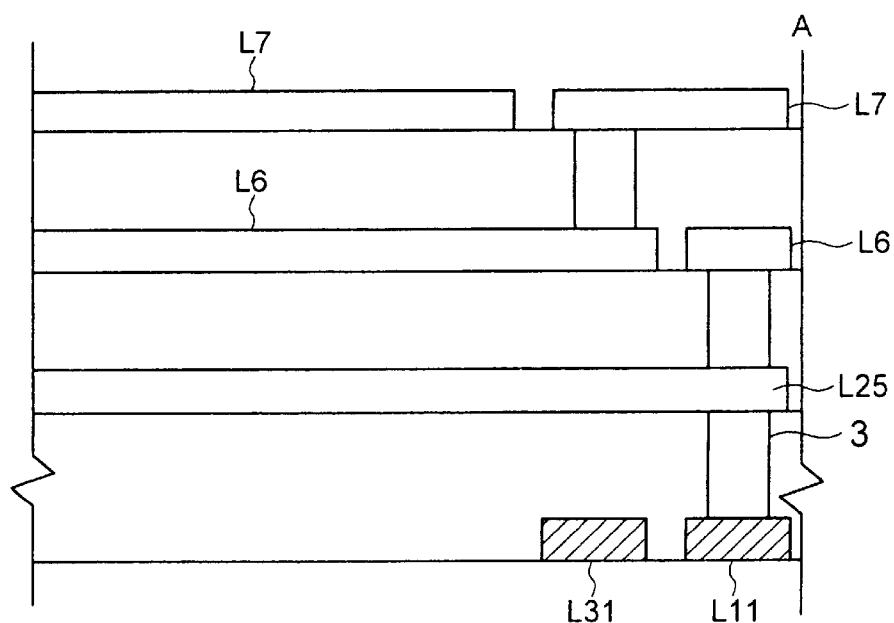
FIG. 6 is a sectional view showing the longitudinal sectional construction of the source inductor of FIG. 5.

Referring to FIG. 5, there is illustrated a third embodiment of the power supply inductor 255. In this embodiment, a wiring layer L7 is additionally formed on the wiring layer L6 constituting the power supply inductor 255 in the FIG. 4 embodiment, the start end of the wiring layer L7 is connected to the power supply pad 211, with its termination end connected to the start end of the wiring layer L6, so as to set up a double coil and thereafter the termination end of the wiring layer L6 is connected to the power supply line 214 of the internal circuit. A longitudinal sectional structure taken along A—A line of FIG. 5 is shown in FIG. 6. According to the present embodiment, the inductance of the power supply inductor 255 can be made to be about twice that of the FIG. 4 embodiment without increasing the occupation area.

Figure 7:
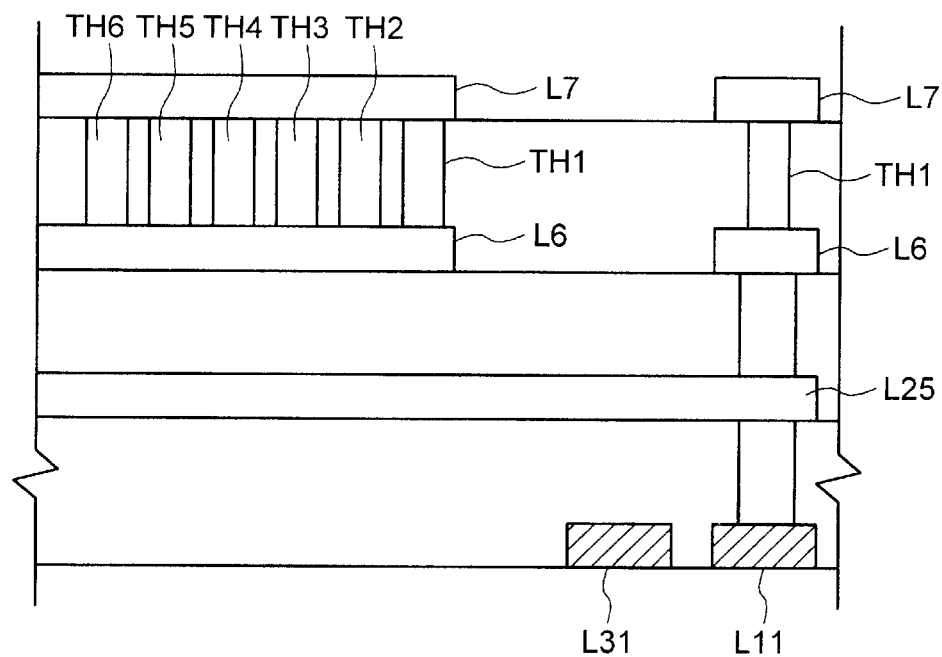
FIG. 7 is a longitudinal sectional view showing a fourth embodiment of the source inductor.

Referring to FIG. 7, there is illustrated a fourth embodiment of the power supply inductor 255. In this embodiment, a wiring layer L7 is additionally formed on the wiring layer L6 constituting the power supply conductor 255 of the FIG. 4 embodiment, and the wiring layer L7 is connected to the underlying wiring layer L6 by a number of through-holes TH1, TH2, TH3 ... FIG. 7 shows a longitudinal section taken at the same site as that in FIG. 6 showing the longitudinal sectional structure along A—A line of FIG. 5. According to this embodiment, the resistance of the power supply inductor 255 can be made to be approximately half that of the FIG. 4 embodiment without increasing the occupation area.

Figure 8:
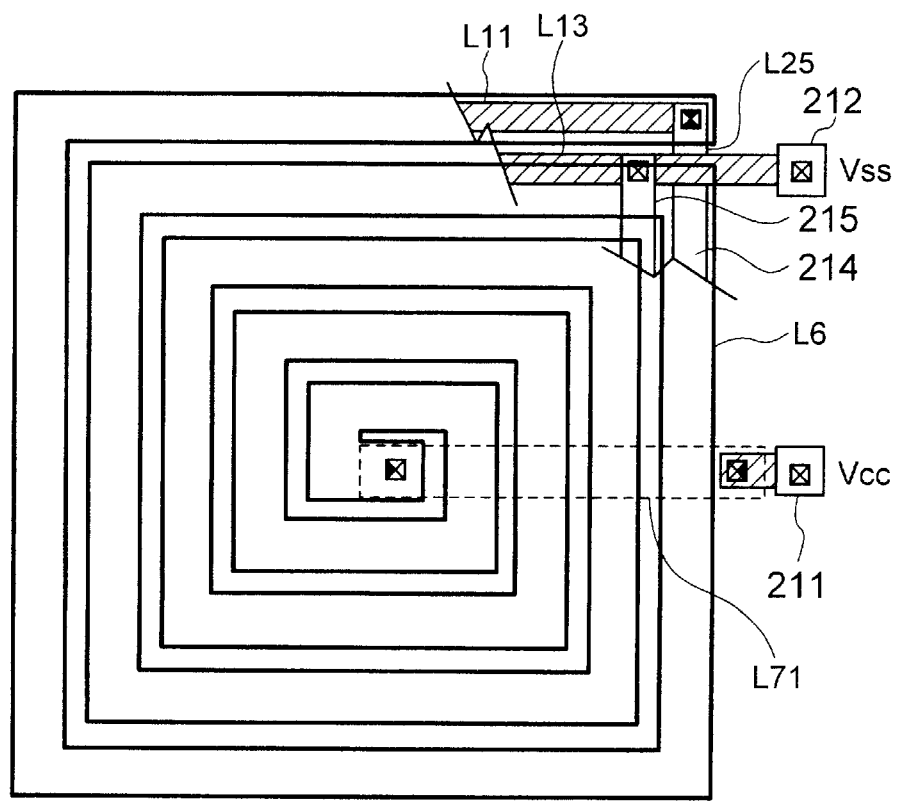
FIG. 8 is a plan view showing a fifth embodiment of the source inductor.

Referring to FIG. 8, there is illustrated a fifth embodiment of the power supply conductor 255. In the present embodiment, instead of setting up the double coil by additionally forming the wiring layer L7 on the wiring layer L6 constituting the power supply conductor 255 as in the case of the FIG. 5 embodiment, a wiring layer L6 is formed spirally to increase the inductance of the power supply inductor 255. In this embodiment, the inner end of a spiral pattern constructed of the wiring layer L6 is connected to the power supply pad 211 through an outgoing line L71 constructed of the wiring layer L7, with the outer termination end of the spiral pattern of the wiring layer L6 connected to the power supply line 214 of the internal circuit. According to this embodiment, the inductance of the power supply inductor 255 can be increased further without increasing the occupation area.

Figure 9:
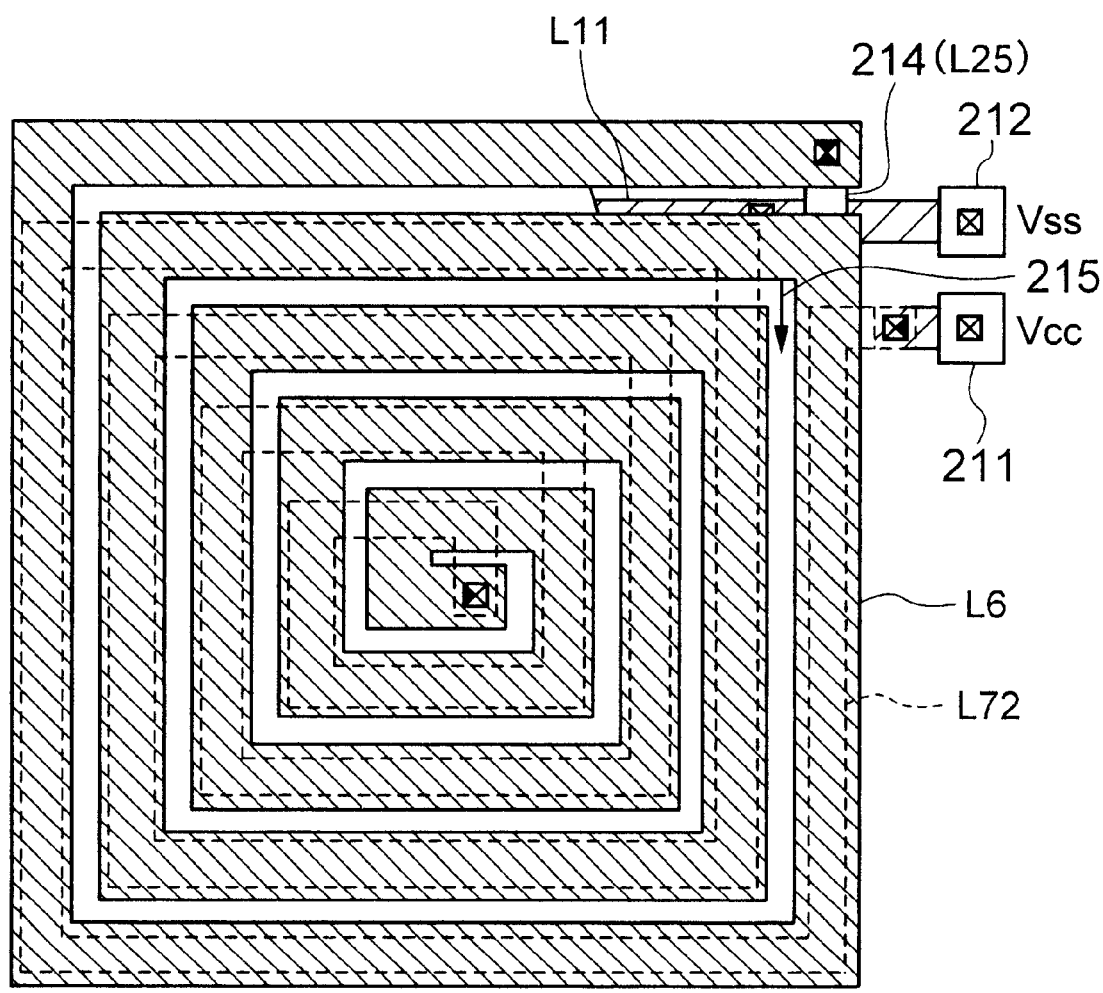
FIG. 9 is a plan view showing a sixth embodiment of the source inductor.

Referring to FIG. 9, there is illustrated a sixth embodiment of the power supply inductor 255. In the present embodiment, a spirally patterned wiring layer L72 is additionally formed on the spirally patterned wiring layer L6 constituting the power supply inductor 255 in the FIG. 8 embodiment to further increase the inductance of the power supply inductor 255. In the present embodiment, the individual wiring layers of the wiring layers are connected in such a manner that the spiral direction of the spirally patterned wiring layer L6 coincides with that of the spirally patterned wiring layer L72, that is, currents flow through the individual spiral patterns in the same direction. This is because if the currents flow through the respective spiral patterns in the opposite directions, then the inductance will be decreased. In this embodiment, the outer start end of the spirally patterned wiring layer L72 is connected to the power supply pad 211 and the outer termination end of the spirally patterned wiring layer L6 is connected to the power supply line 214 of the internal circuit. According to this embodiment, the inductance of the power supply inductor 255 can be made to be about twice that of the FIG. 8 embodiment without increasing the occupation area.

Figure 10:
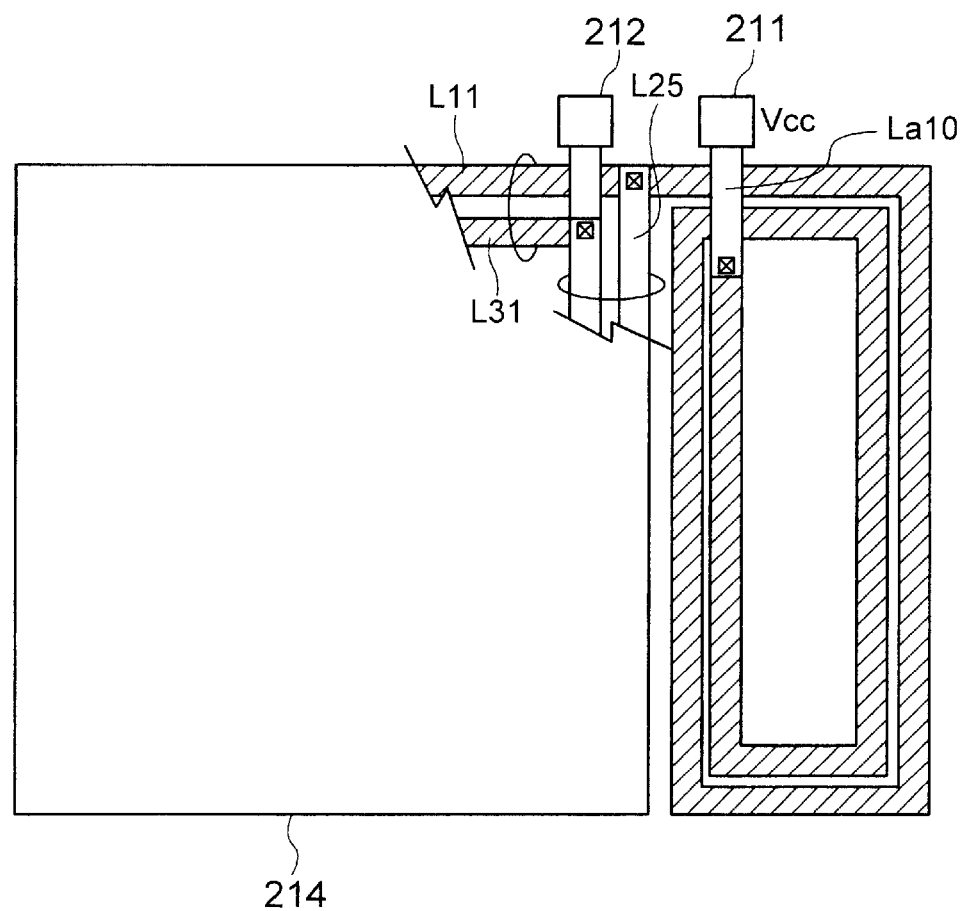
FIG. 10 is a plan view showing a seventh embodiment of the source inductor.

Referring to FIG. 10, there is illustrated a seventh embodiment of the power supply inductor 255. In this embodiment, an inductor forming area is provided outside the internal circuit forming area and a wiring layer is formed in a spiral pattern to provide an inductor. One end of the spiral pattern is connected to the power supply line 214 of the internal circuit and the other end is connected via a through-hole to an outgoing line wiring layer La10 which in turn is connected to the power supply pad 211. According to this embodiment, the occupation area increases but the power supply inductor 255 can be formed without increasing the number of additional wiring layers.

Figure 11:
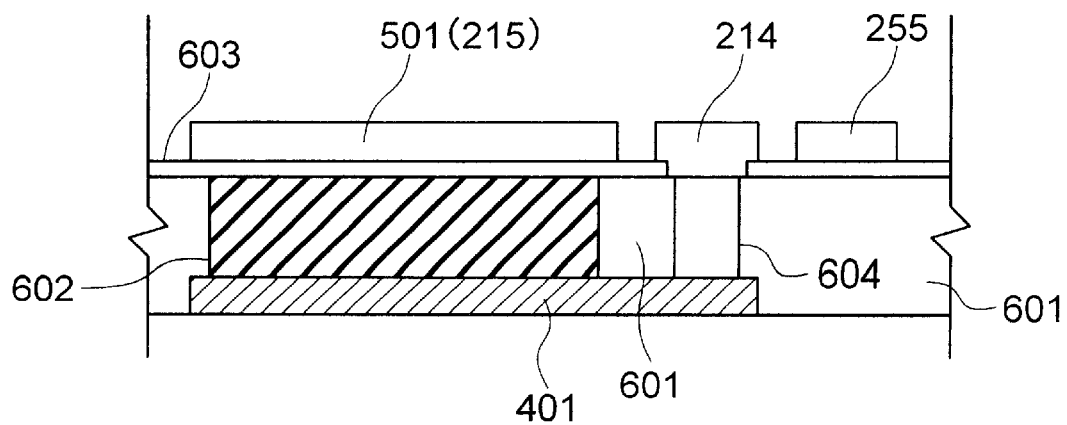
FIG. 11 is a longitudinal sectional view showing a concrete example (first embodiment) of source capacitor constituting part of a bypass capacitor.

Referring to FIG. 11, there is illustrated an example of concrete structure of capacitors constituting the bypass capacitor that are formed in the capacitor areas 253a to 253f shown in FIG. 3 and at intersections of wiring layer conductors constituting the power supply line 214 and wiring layer conductors constituting the ground line 215. FIG. 11 shows a longitudinal section taken at the same site as that indicated by line B—B of FIG. 3.

In FIG. 11, reference numeral 401 designates one electrode of the capacitor, 501 the other electrode and 601 an insulating film for insulating these electrodes (wiring layers). The one electrode 401 of the capacitor is electrically connected to the wiring layer constituting the power supply line 214 via a through-hole 604. In this embodiment, a hole is formed in the insulating film 601 interposed between the electrodes 401 and 501, a connection plug 602 made of high melting point metal such as tungsten is embedded in the hole and an insulating film 603 made of, for example, silicon nitride having high dielectric constant is formed to cover the connection plug 602 and insulating film 601, thereby ensuring that a capacitor having a high capacitance per unit area can be obtained.

Figure 12:
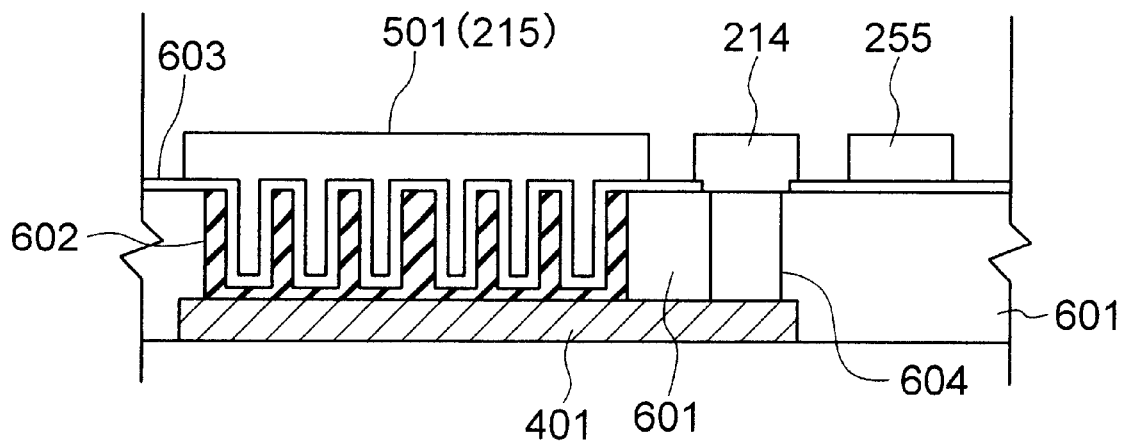
FIG. 12 is a longitudinal sectional view showing a second embodiment of the source capacitor constituting part of the bypass capacitor.

Referring to FIG. 12, there is illustrated another structural example of the capacitor constituting the bypass capacitor. In this embodiment, a plurality of grooves are further formed in the connection plug 602 embedded in the hole formed in the insulating film 601 interposed between the electrodes 401 and 501 in the FIG. 11 embodiment. By forming an insulating film 603 over the grooves in the plug 602 and the insulating film 601, the substantial opposing areas of the electrodes 401 and 501 can be increased to obtain a capacitor, which capacitor is further increased in capacitance per unit area.

Figure 13:
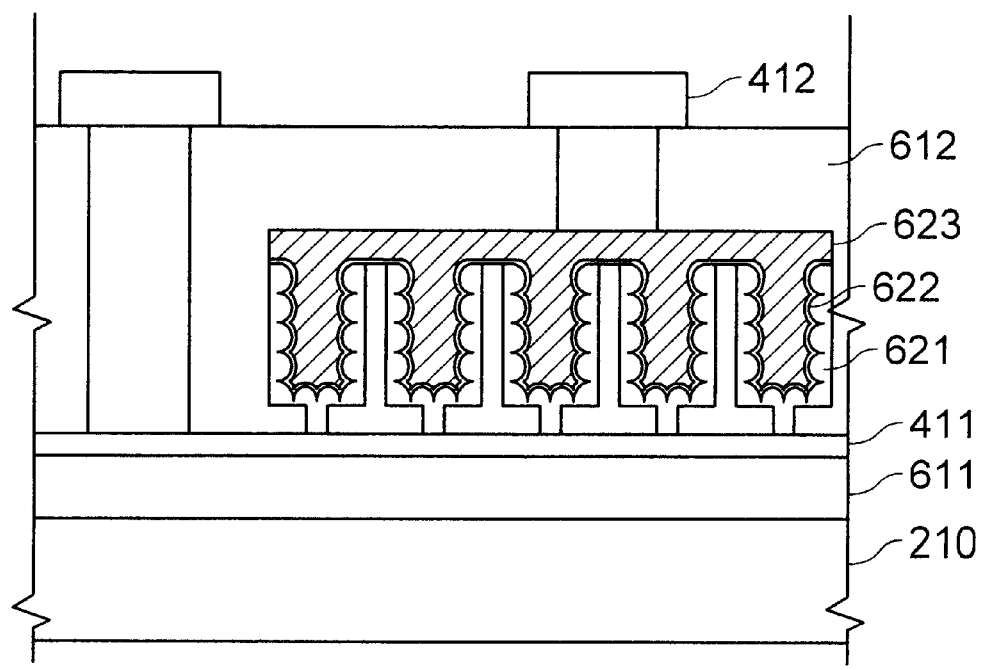
FIG. 13 is a longitudinal sectional view showing a third embodiment of the source capacitor constituting part of the bypass capacitor.

Referring to FIG. 13, there is illustrated a further structural example of the capacitor constituting the bypass capacitor. In this embodiment, for formation of the capacitor constituting the bypass capacitor, the recent capacitor forming technique in the dynamic RAM is utilized. In the embodiment of FIG. 13, reference numeral 611 designates an insulating film formed on the surface of semiconductor chip 210, 411 one wiring layer formed on the insulating film 611, 612 an inter-layer insulating film formed on the wiring layer 411, and 412 the other wiring layer formed on the inter-layer insulating film 612. In this embodiment, two-stepped grooves are formed in the insulating film 612, a poly-silicon layer 621 is formed on the inner walls of the grooves through, for example, CVD process, a thin silicon nitride film 622 is additionally formed on the surface of the poly-silicon layer 621, and metal 623 such as titanium nitride is embedded in the resulting grooves and connected to the wiring layer 412.

Figure 14:
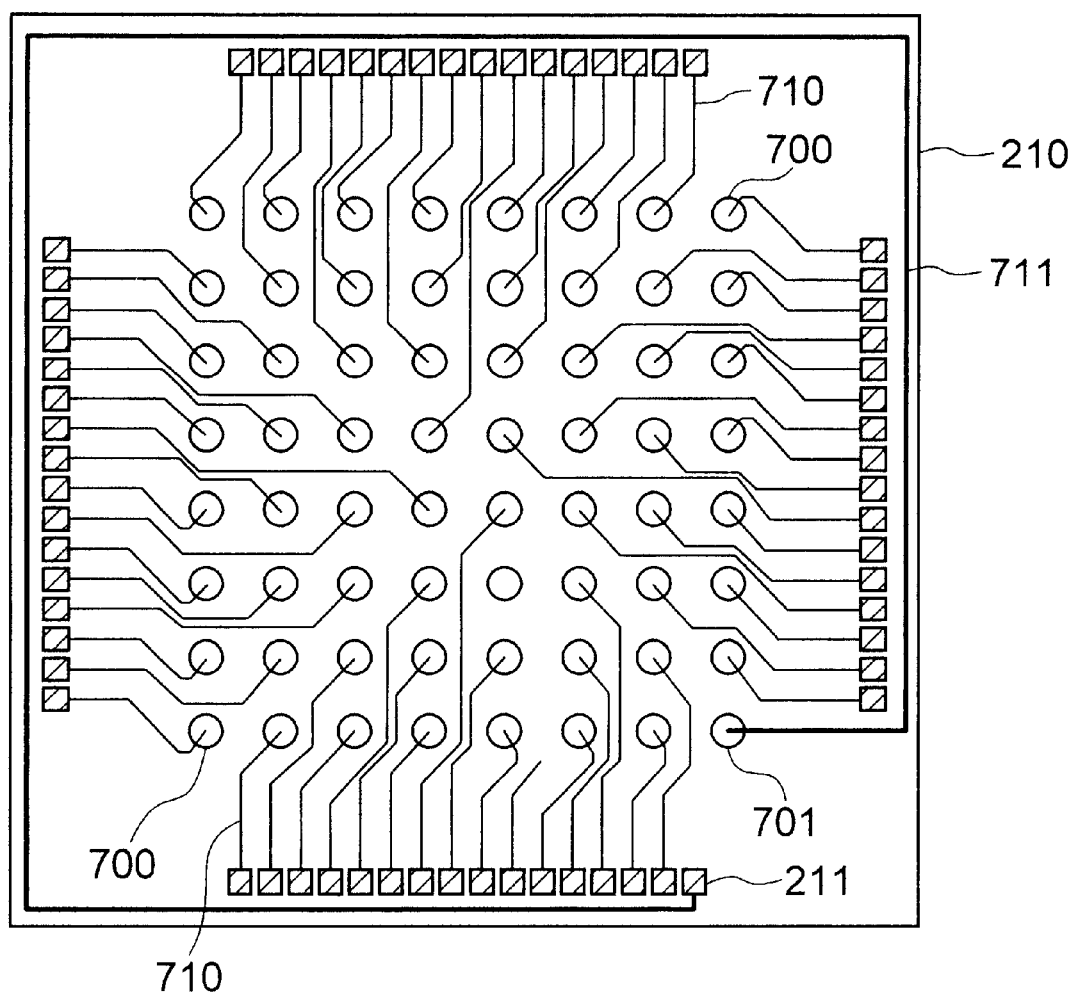
FIG. 14 is a plan view showing an embodiment of the source inductor when the invention is applied to an LSI of WPP structure.

Referring to FIG. 14, there is illustrated an eighth embodiment of the power supply inductor 255. This embodiment is an example applied to an LSI of WPP (wafer process package) structure. In the present embodiment, a plurality of pads including a power supply pad 211 are formed along the peripheral edge of a semiconductor chip 210, a number of conductive bumps 700 are formed in matrix at a suitable pitch on a passivation film in the center of the chip, and the pads at the chip peripheral edge inclusive of the pads 211 and the corresponding bumps 700 are connected to each other by wiring conductors 710 formed of conductive layers formed on the passivation film. The above bumps 700 are electrically connected to lead pins provided in a package form such as pin grid array by being connected to the inner ends of the individual lead pins through conductive balls.

In this embodiment, a wiring conductor 711 for connecting the power supply pad 211 and the corresponding power supply bump 701 is particularly formed, which wiring conductor makes a loop around the chip 210 to form a source inductor. In FIG. 14, the wiring conductor 711 serving as the power supply inductor is shown in association with only one power supply pad but in case a plurality of power supply pads are used, source inductors formed of similar pulled-about wiring conductors may be provided in association with the remaining power supply pads.

Figure 15:
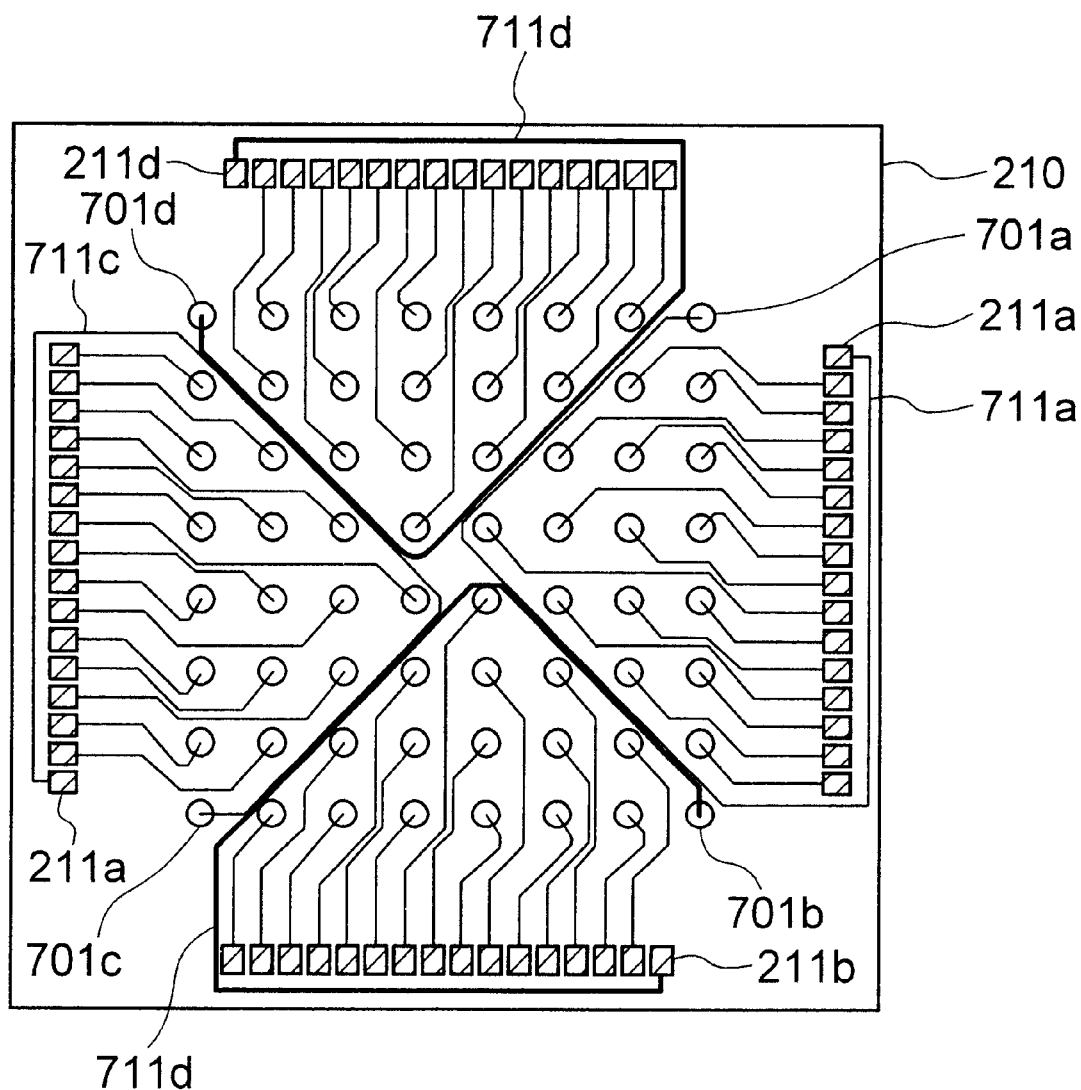
FIG. 15 is a plan view showing another embodiment of the source inductor when the invention is applied to the LSI of WPP structure.

Referring to FIG. 15, there is illustrated another embodiment of the power supply inductor 255 in the LSI of WPP structure. This embodiment is an example effective for the case where it is desired that a plurality of power supply pads be used and one wiring layer be formed in a semiconductor chip. Wiring conductors 711a to 711d led out of power supply pads 211a to 211d, respectively, and serving as source inductors are each extended along one side of the chip in the same rotation direction, further extended toward the center of the chip along diagonal lines of the chip and caused to U-turn at the central portion so as to be connected to corresponding power supply bumps 701a to 701d.

Figure 16:
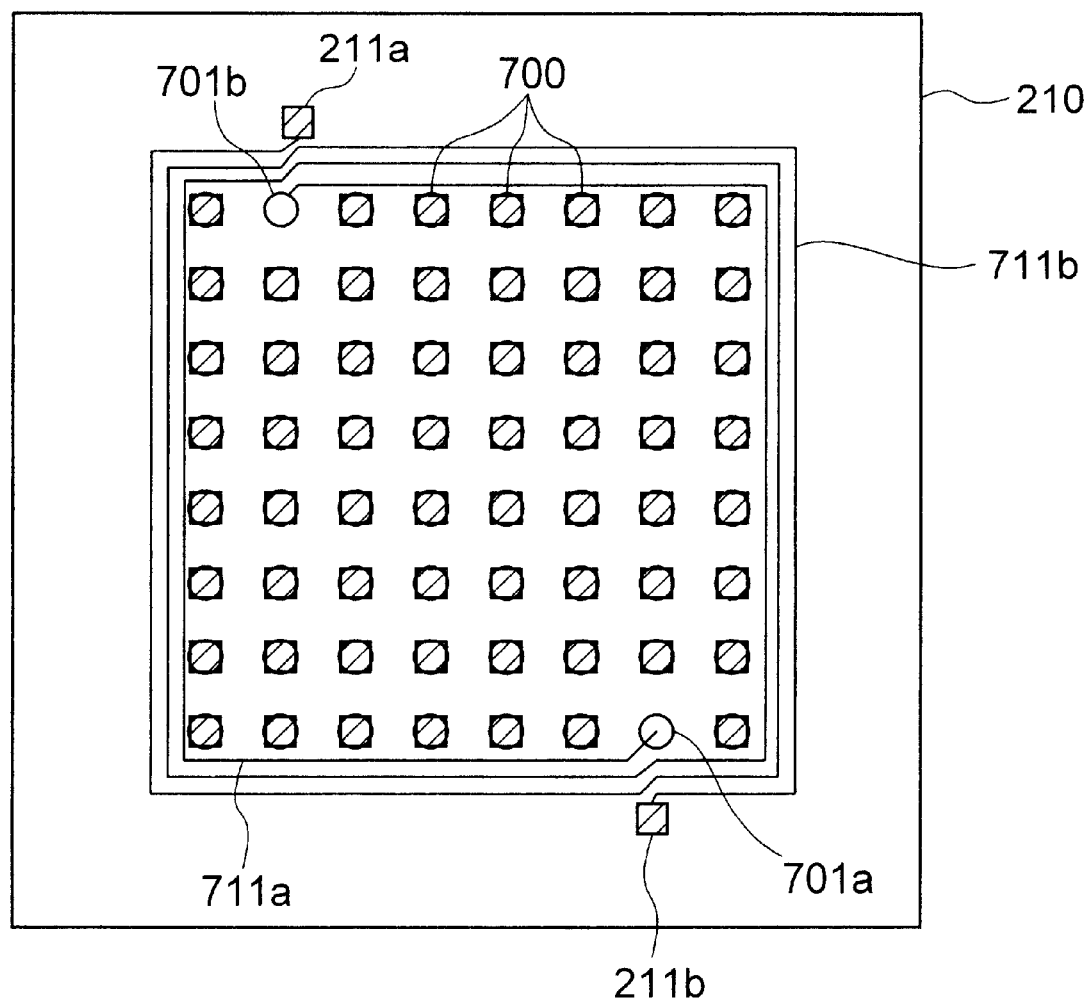
FIG. 16 is a plan view showing another embodiment of the source inductor when the invention is applied to the LSI of WPP structure.

Referring to FIG. 16, there is illustrated still another embodiment of the power supply inductor 255 in the LSI of WPP structure. This embodiment is an example effective for the case where a plurality of power supply pads are provided for the semiconductor chip and there is a space margin between the pads and bumps 700. Wiring conductors 711a and 711b serving as power supply inductors and led from individual power supply pads 211a and 211b are each formed into a spiral form to increase the inductance.

Figure 17:
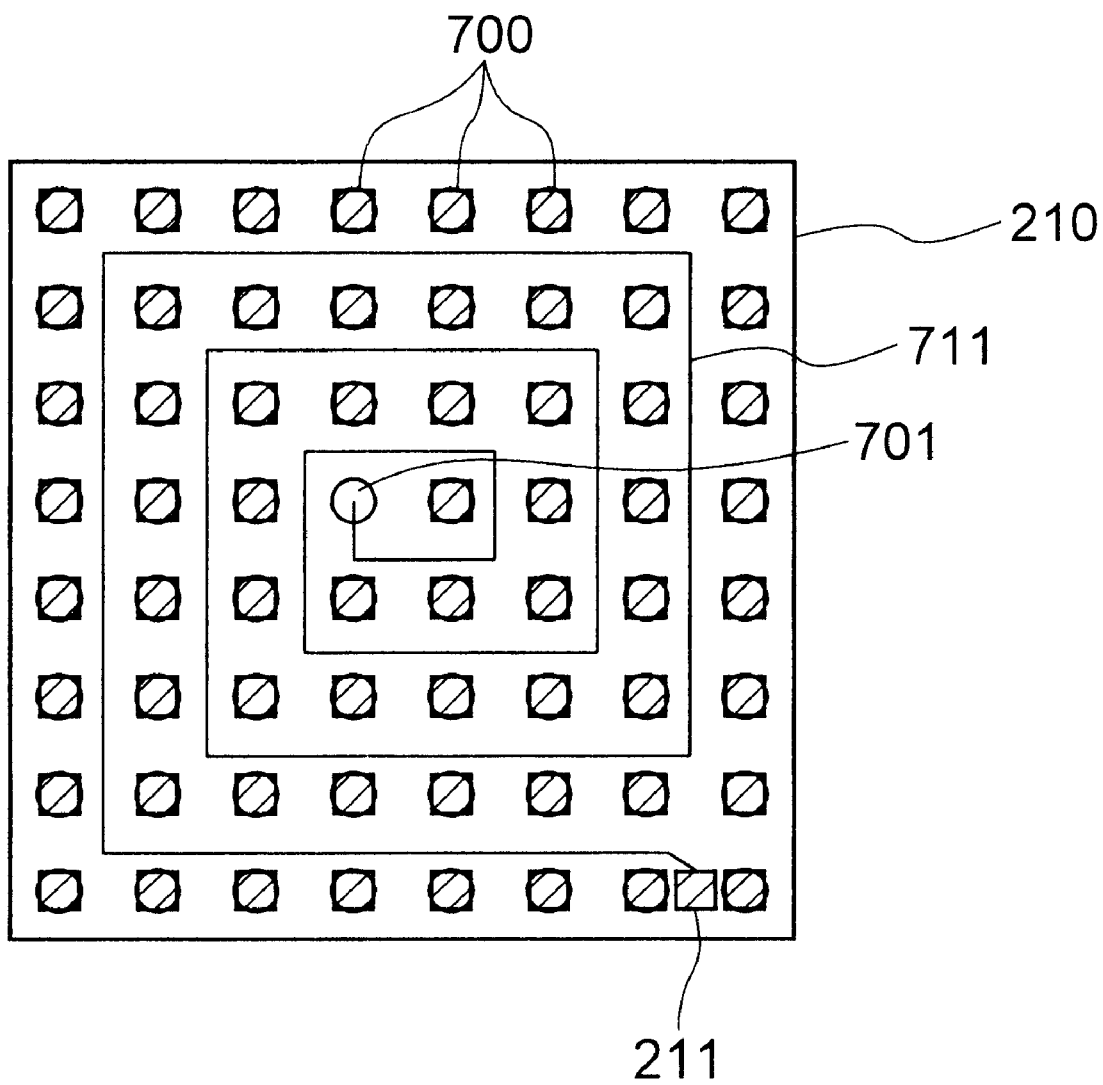
FIG. 17 is a plan view showing still another embodiment of the source inductor when the invention is applied to the LSI of WPP structure.

Referring to FIG. 17, there is illustrated an example of wiring conductor 711 serving as the power supply inductor, the example being effective for the case where the inductance is desired to be further increased. This embodiment is, however, valid under condition that a power supply bump 701 is provided near the center of the chip. In FIG. 17, the wiring conductor 711 serving as the power supply inductor in association with only one power supply pad is illustrated but in case a plurality of power supply pads are provided, power supply inductors formed of similar spiral pulled-about wiring conductors are provided in association with the remaining power supply pads.

Next, how to determine the inductance and capacitance of the inductor and bypass capacitor constituting the decoupling circuit and formed on the semiconductor chip according to the foregoing embodiments will be described.

Figure 18:
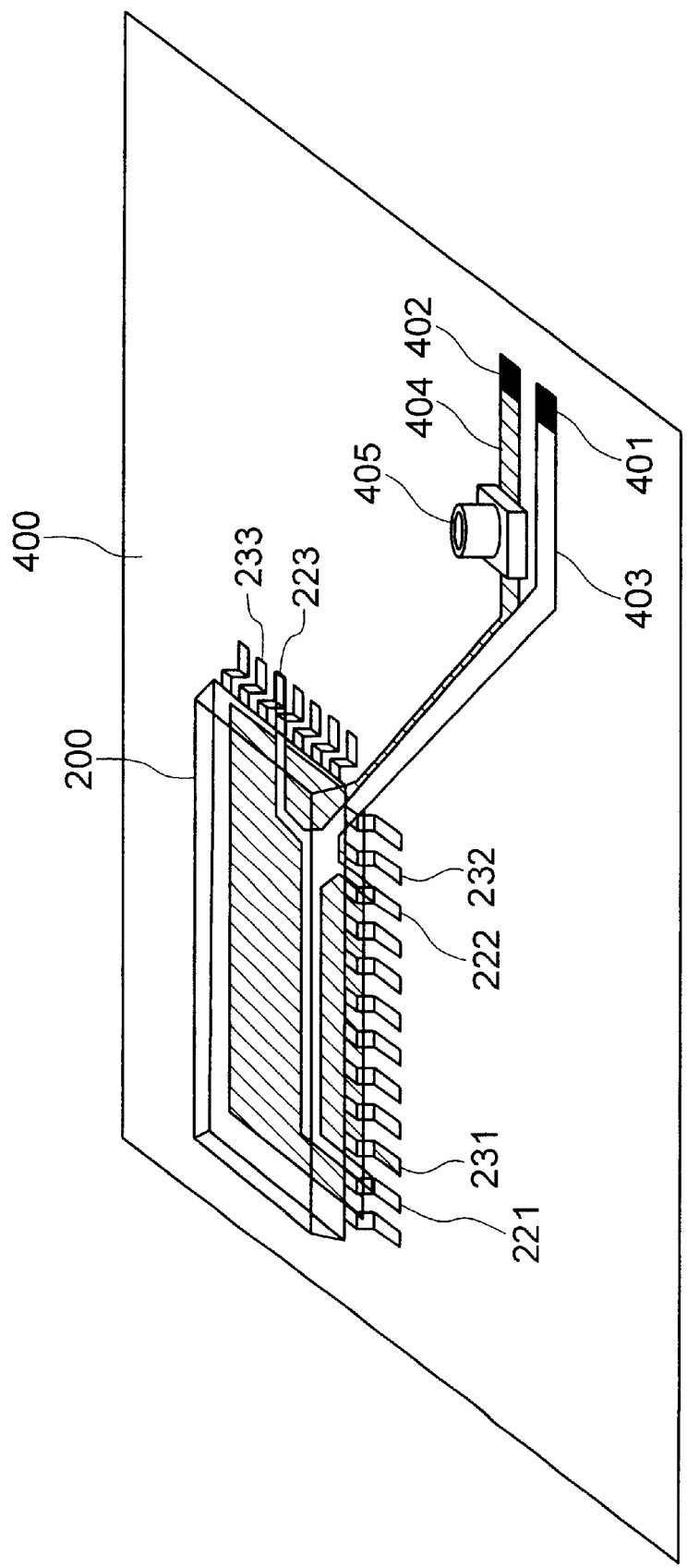
FIG. 18 is a perspective view showing the schematic construction of a measuring board fabricated for knowing source impedance and source current in a standard LSI.

The present inventors have considered that the inductance and capacitance of the inductor and bypass capacitor constituting the decoupling circuit on the semiconductor chip can be determined through simulation if the source impedance (internal resistance Rchip and parasitic capacitance Cchip) and source current (=consumption current) in the LSI are known. Then, in order to first know the source impedance and source current in a standard LSI, the present inventors have fabricated a measuring board as shown in FIG. 18. In the figure, reference numeral 400 designates a printed circuit board, 200 an LSI representing an object to be measured, 401 a feed terminal of source voltage Vcc provided on the printed circuit board, 402 a feed terminal of ground potential GND, 403 a power supply line for connecting the feed terminal 401 of source voltage Vcc to external source terminals 221, 222 and 223 of the LSI, 404 a ground line for connecting the feed terminal 402 of ground potential GND to external ground terminals 231, 232 and 233 of the LSI, and 405 a superplastic metal alloy (SMA) connector provided on the way of the ground line 404.

Figure 19:
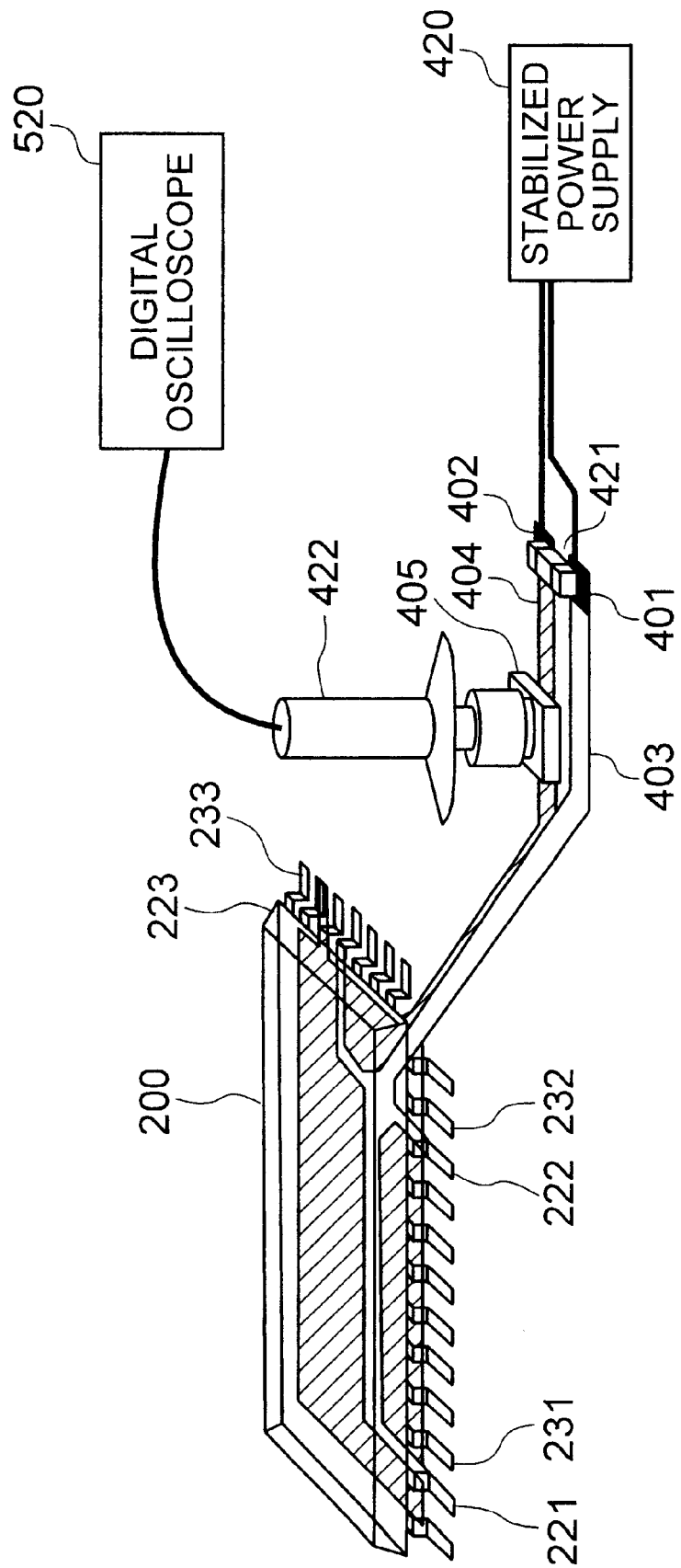
FIG. 19 is a perspective view showing the schematic construction of a current measuring instrument for measuring the source current in the LSI by using the FIG. 18 measuring board.
Figure 21:
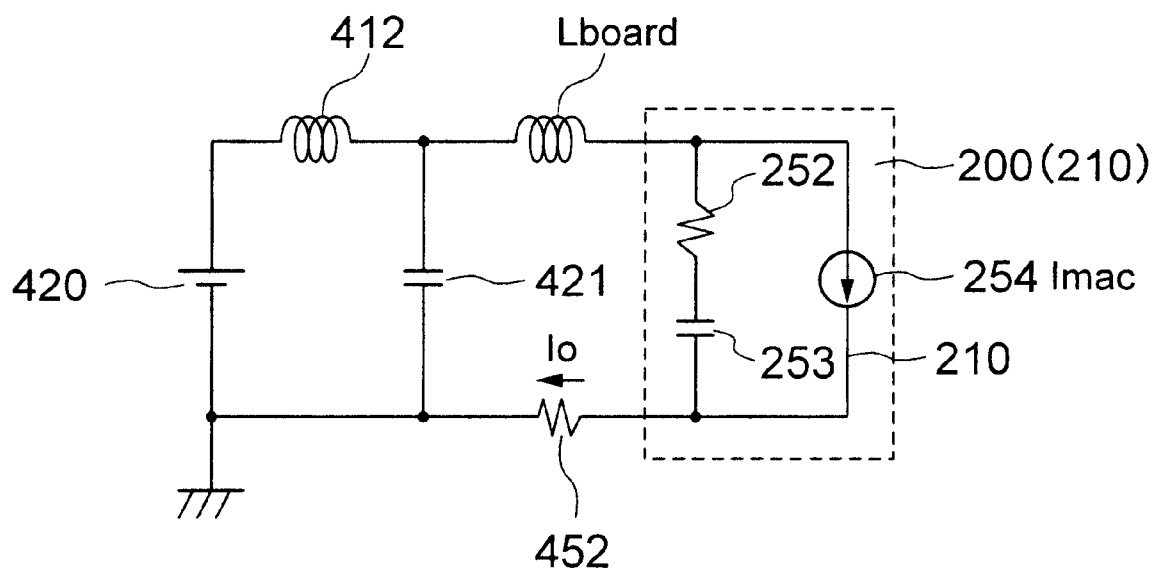
FIG. 21 is a circuit diagram showing an equivalent circuit of the FIG. 19 current measuring instrument.

Referring then to FIG. 19, for measuring source current in the LSI by using the board of FIG. 18, a digital oscilloscope 520 is connected to the SMA connector 405 via an 1 Ω built-in SMA connector probe 422, a stabilized power supply 420 is connected to the feed terminals 401 and 402 of the source voltage Vcc and ground potential GND and a bypass capacitor 421 for suppressing voltage changes due to impedance components of the power supply lines 403 and 404 and power supply connection cable on the board is connected across the feed terminals 401 and 402, thus constructing a source current measuring instrument, with which source current IO going out of the LSI under a stationary state is measured. The FIG. 19 measuring instrument can be represented by an equivalent circuit as shown in FIG. 21 where reference numeral 412 designates an inductance of a cable for connection of the power supply 420, Lboard an inductance of the power supply line 403 on the board lead terminal and bonding wire of the LSI packages and 421 the bypass capacitor connected across the feed terminals 401 and 402. In measurement of DC source current, however, the inductance 412 is zero and the bypass capacitor 421 is of infinity equivalent to the absence thereof. For high frequencies, the bypass capacitor 421 can be regarded as being short-circuited. Accordingly, from the current value IO obtained from the above measurement, current value Imac flowing through a load or current source 254 in the LSI 200 can be known. Namely, in terms of average current, Imac=IO stands. When frequency characteristics are required to be considered, a frequency characteristic IO(ω) calculated by Fourier-transforming a time waveform IO(t) of the source current IO is used to express Imac(ω) by the following equation (3):

$$Imac(\omega) = \frac{\frac{1}{R + \frac{1}{j\omega Cchip}} + \frac{1}{1 + j\omega Lboard}}{\frac{1}{1 + j\omega Lboard}} IO(\omega) \quad (3)$$

Further, from an alternating component of measuring current IO removed of a DC component, a source current noise level can be known. Alternatively, a spectrum analyzer may be connected in place of the digital oscilloscope of FIG. 19 to measure an AC frequency or source current noise level of the source current IO.

Currents flowing through all current sources in the LSI 200 are totalized so as to be represented by the Imac that is current flowing through the single virtual current source 254. Resistor 452 is a built-in resistor r (=1 Ω) of the SMA connector probe 422 and the digital oscilloscope 520 measures terminal voltage VO across the resistor 452 to obtain current value IO that is determined from IO=VO/r. Power supply wiring on the board and lead terminals and boding wire of the LSI package have an inductance component as designated by Lboard (an inductance component of wiring in the chip is relatively small and so neglected). Accordingly, a portion bounded by dashed line 200 in FIG. 21 corresponds to an equivalent circuit of the LSI. Further, in the measuring instrument of FIG. 19, wiring on the board is depicted as being shorter than that on the practical system board. Actually, the inductance of wiring on the board is negligibly smaller than that on the package. Accordingly, the inductor Lboard in FIG. 20 can substantially be regarded as the inductance component of the package.

Next, for measuring the source impedance in the LSI by using the board of FIG. 18, an impedance measuring instrument is constructed by inserting a short-circuiting part 411 into the SMA connector 405 to short-circuit the ground line 402 and connecting an impedance analyzer 510 and the power supply 420 across the feed terminals 401 and 402 of source voltage Vcc and ground potential GND. The impedance analyzer 510 superimposes an AC waveform on generation voltage VCCO of the power supply 420 to measure the impedance of the LSI 200.

The impedance on the Vcc side of power supply 420 is raised by being connected to the feed terminal 401 through a ferrite fuse 412 to thereby enable the impedance analyzer 510 to measure only the impedance of the LSI exclusive of the impedance of the power supply 420. The bypass capacitor 421 is connected across the feed terminals 401 and 402 in the measuring instrument of FIG. 19 whereas the bypass capacitor is omitted in the measuring instrument of FIG. 20. This is because in the FIG. 20 measuring instrument, an AC current is applied to the LSI and the impedance will be lowered if the bypass capacitor is inserted.

Figure 20:
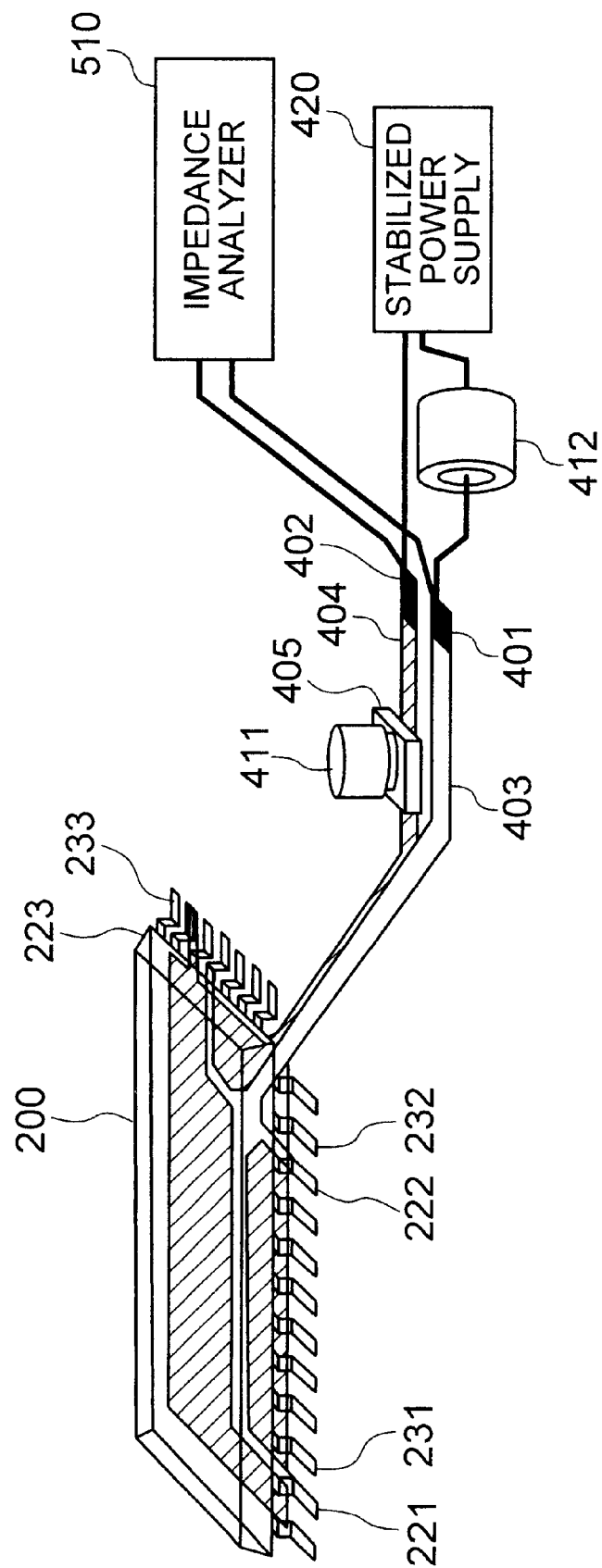
FIG. 20 is a perspective view showing the schematic construction of an impedance measuring instrument for measuring the source impedance of the LSI by using the FIG. 18 measuring board.
Figure 22:
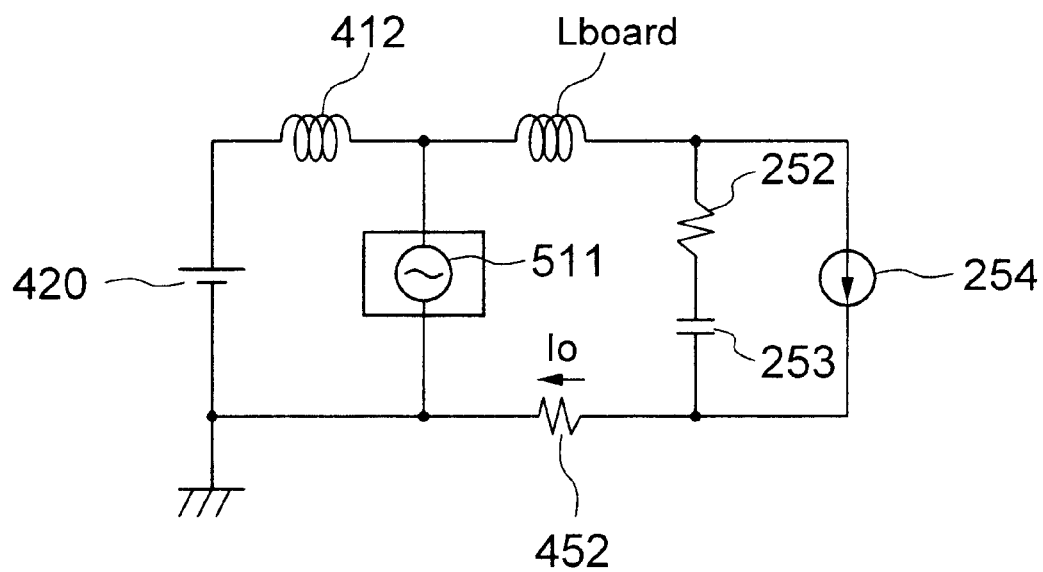
FIG. 22 is a circuit diagram showing an equivalent circuit of the FIG. 20 impedance measuring instrument.

Then, the FIG. 20 measuring instrument is equivalent to a circuit as shown in FIG. 22. From the source impedance of LSI measured with the FIG. 20 instrument and the source current value IO of LSI measured with the FIG. 19 measuring instrument, the inductance Lboard of the power supply lines 403 and 404 on the board (inclusive of the inductance of the package), the internal resistance Rchip and parasitic capacitance C chip of the LSI are calculated pursuant to a circuit equation. In FIG. 22, reference numeral 412 designates an inductance component of the ferrite fuse (inclusive of an inductance component of power supply cable) and 511 the FIG. 20 impedance analyzer 510 including an AC power supply for applying a high frequency component to the LSI. In addition to the AC power supply, the impedance analyzer 510 includes an impedance of the probe and connection cable and an input resistance. These types of impedance and resistance, however, can be known through measurement conducted by placing the tip of the probe in open condition (resistance=∞), short condition (resistance=0) and sample load condition (for example, a resistance of 50 Ω). Therefore, the aforementioned calculated values are corrected on the basis of the thus measured values.

Next, simulation of the FIG. 21 equivalent circuit modeling the FIG. 19 measuring instrument is carried out with a circuit simulator to determine an AC component of source current IO (source current noise level) in the LSI 200 at intervals of 40 MHz within a range of from 40 MHz to 480 MHz and source current frequency characteristics of the LSI 200 are examined. Also, by using the spectrum analyzer in place of the digital oscilloscope 520 in the FIG. 19 measuring instrument, frequency characteristics of the source current IO in the LSI 200 are measured.

Figure 23:
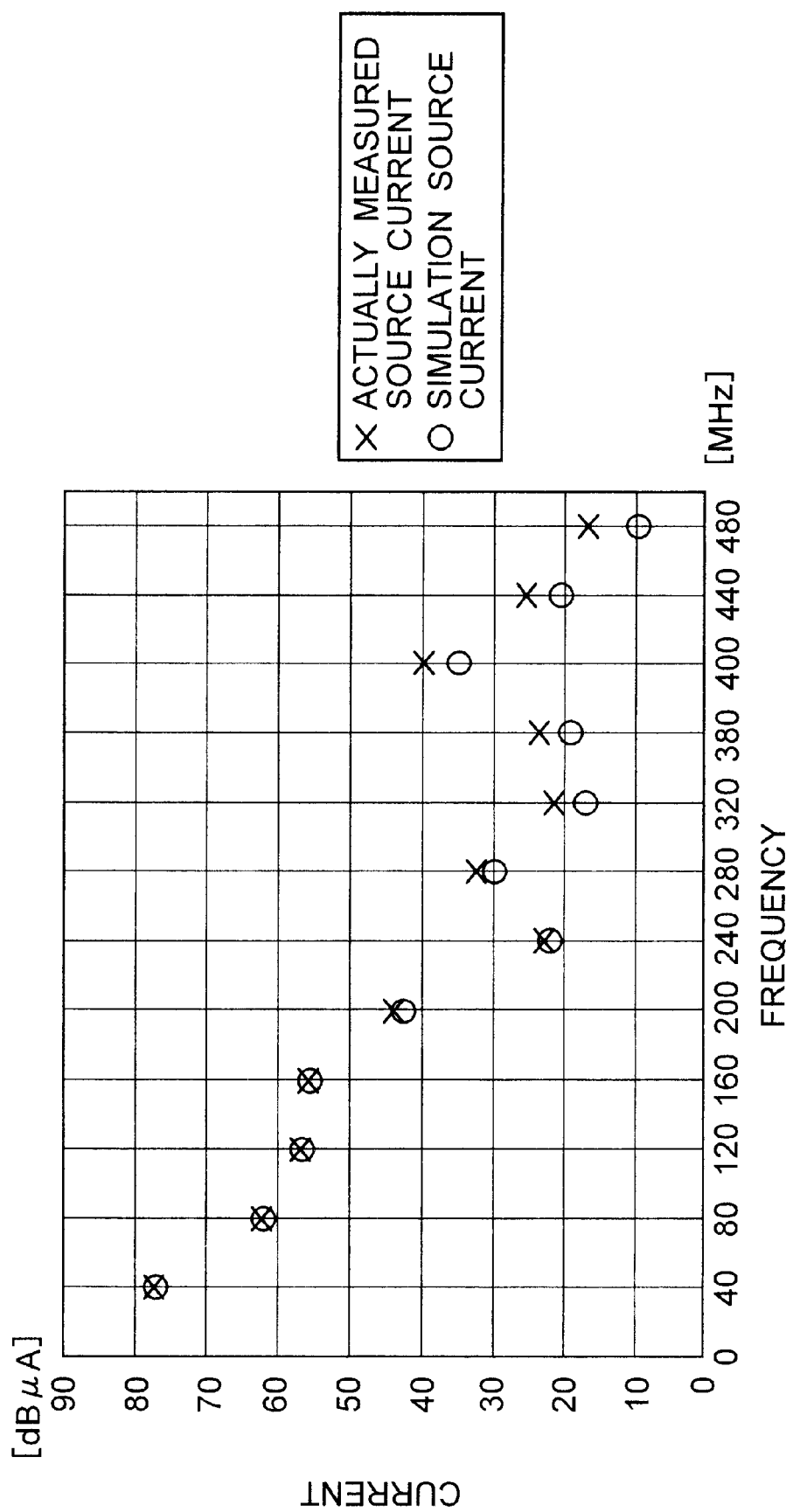
FIG. 23 is a graph showing a source current noise level characteristic calculated through simulation and a source current noise level characteristic measured with the FIG. 19 measuring instrument.

In FIG. 23, source current noise levels calculated through simulation as described above are indicated by ○ mark and source current noise levels measured with the FIG. 19 measuring instrument are indicated by × mark. As will be seen from comparison of ○ mark with × mark in FIG. 23, values of the source current noise levels obtained through simulation are very close to values of source current noise levels measured experimentally and the maximum difference between the simulation result and the actually measured value is 1.3 dB at frequencies of less than 200 MHz, demonstrating that sufficient accuracy can be obtained in the operation frequency band of the general LSI. This confirms that the FIG. 21 modeling is correct.

Figure 24:
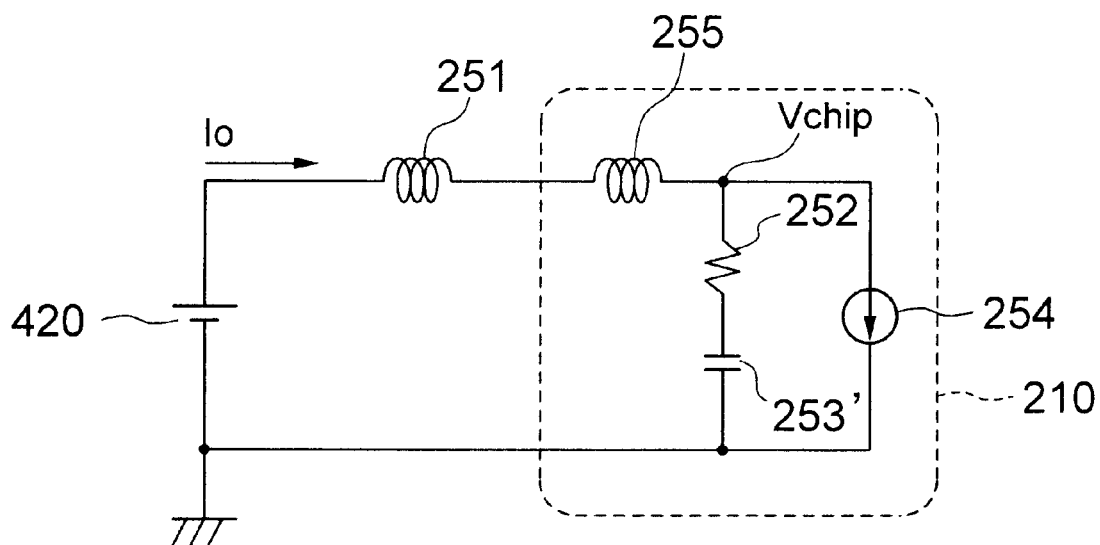
FIG. 24 is a circuit diagram showing an equivalent circuit including a package of an LSI incorporated with inductance.
Figure 25:
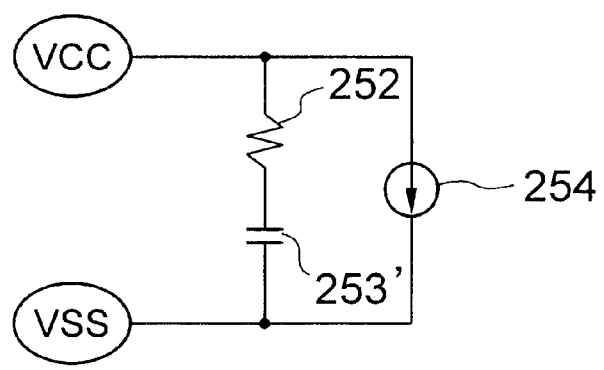
FIG. 25 is a circuit diagram showing an equivalent circuit of an LSI devoid of inductance.

Next, for determination of the inductance and capacitance of the source inductor and bypass capacitor built in the LSI, simulation is carried out with an equivalent circuit of FIG. 24. In FIG. 24, reference numeral 255 designates an inductor (Lchip) inserted in the power supply line of the LSI chip 210 and formed of a wiring pattern as described in connection with the foregoing embodiments, 251 an inductance component (Lboard) of the board and the LSI package and 253' the sum (Cchip) of a capacitance parasitic to the power supply wiring of the LSI chip and a capacitance of the bypass capacitor provided between power supply wiring conductors in the foregoing embodiments. Here, the resistance Rchip parasitic to the power supply wiring of the LSI chip and the capacitance parasitic to power supply wiring included in the source capacitance Cchip can be known from the simulation based on the equivalent circuit of FIG. 22 and so the known values are used. An equivalent circuit of the LSI in the absence of the source inductance is shown in FIG. 25.

The equivalent circuit of FIG. 24 is devoid of the resistor 452 of FIG. 21. Therefore, when determining current Ichip of the in-chip current source 254 in the equivalent circuit of FIG. 25, a voltage drop across the resistor 452 is taken into consideration so as to use current Ichip indicated by Ichip= Imac (VCC−VSS)/Vchip0 in place of current Imac obtained through the simulation based on the circuit of FIG. 21. Here, Vchip 0 means a voltage across the terminals of the in-chip current source 254 and is expressed by Vchip0=VCC0−V0, where VCC0 represents a generation voltage of the power supply 420 and V0 represents a voltage across resistor 452 that is expressed by 1 Ω ×(time average of Imac).

Figure 26A:
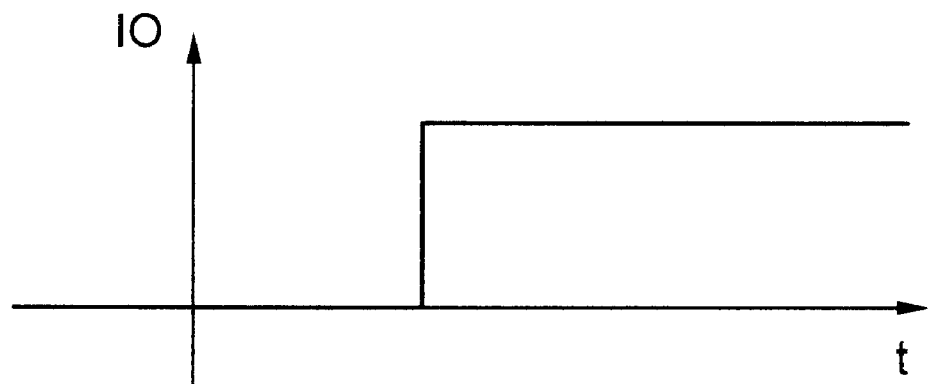
FIGS. 26A and 26B are waveform diagrams showing the current passed through the LSI chip and the behavior of a change in source voltage of the LSI chip, respectively, when voltage drop level ΔV in the LSI is calculated.
Figure 26B:
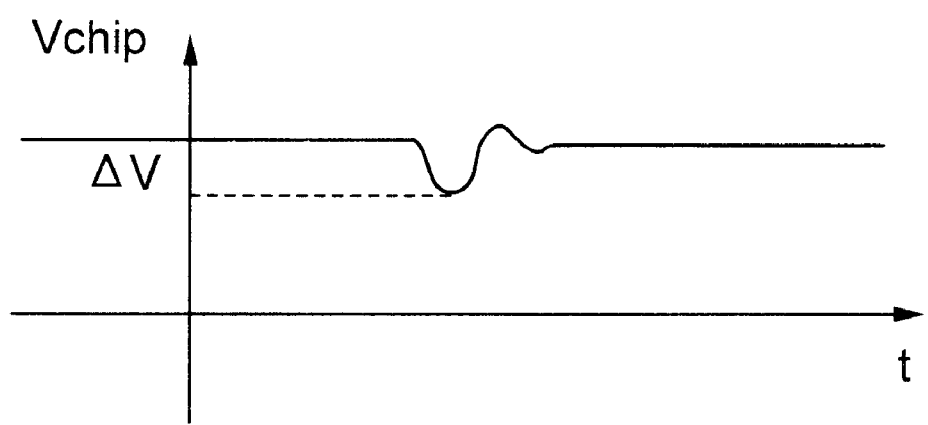

In the simulation, the source capacitance Cchip and source inductance Lchip in the LSI are used as parameters. Source current noise levels under a stationary state when values of the parameters are changed variously and voltage drop levels ΔV when the source voltage Vcc of the chip changes as shown in FIG. 26B at the time that the source current IO is raised as shown in FIG. 26A are obtained. The source current noise level referred to herein corresponds to a noise level at a frequency of 40 MHz at which the noise level is maximized within the range of from 40 MHz to 480 MHz as will be seen from FIG. 23.

Figure 27:
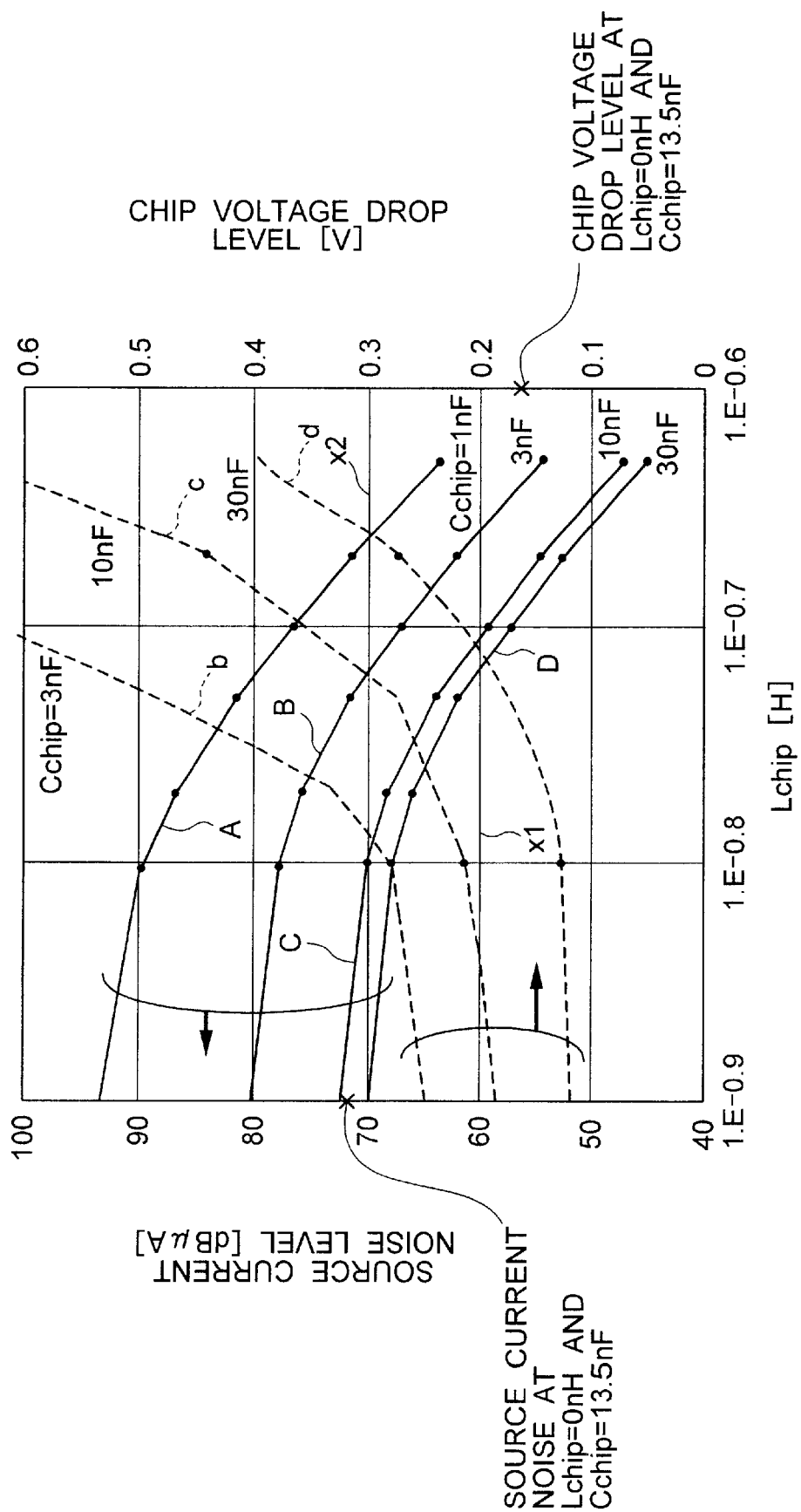
FIG. 27 is a graph of characteristics showing a source current noise level change characteristic and a chip voltage drop level change characteristic when the source inductance is changed through simulation.

Results of the simulation are shown in a graph of FIG. 27. For respective values 1 nF, 3 nF, 10 nF and 30 nF of the source capacitance Cchip of the chip, the source inductance Lchip is changed within a range of $1 \times 10^{-9}$ to $1 \times 10^{-6}$ H to obtain such characteristics of change of source current noise level as indicated by solid curves A, B, C and D in FIG. 27. For respective values 3 nF, 10 nF and 30 nF of the source capacitance Cchip, the source inductance Lchip is changed within the range of $1 \times 10^{-9}$ to $1 \times 10^{-6}$ H to obtain such characteristics of change of voltage drop level as indicated by dotted curves b, c and d. In FIG. 27, ordinate on the left side represents the scale of source current noise level and ordinate on the right side represents the scale of voltage drop level.

In practically designing the LSI, the source inductance and source capacitance must be determined such that the source current noise level and voltage drop level do not exceed their maximum permissible values. For the voltage drop level, a critical value above which the LSI is liable to operate erroneously is set as a maximum permissible value. For the source current noise level, a noise level precedently set in design step as a regulation value when a source current noise in excess of a certain value is desired to be prevented from leaking from the LSI chip to the outside with the aim of suppressing the electromagnetic radiation dosage from the power supply wiring on the board to a certain value or less is determined as a maximum permissible value.

The procedure for concretely determining the source inductance and source capacitance of the LSI will be described by making reference to FIG. 27. For example, in case a source capacitance of about 10 nF seems to be maintained when the maximum permissible value of source current noise level of the LSI to be designed is 60 dBμA, a source inductance is determined from an intersection of horizontal rule line X1 that crosses a point of 60 dBμA on the scale of source current noise level on the left side of FIG. 27 and solid curve C indicative of a source current noise level characteristic at a source capacitance of 10 nF. It will be seen that the source inductance can be about $1 \times 10^{-7}$ H in the case of FIG. 27.

On the other hand, in case a capacitance of about 10 nF seems to be maintained when the maximum permissible value of voltage drop level is 0.3 V, a source inductance is determined from an intersection of horizontal rule line X2 that crosses a point of 0.3 V on the scale of voltage drop level on the right side of FIG. 27 and dotted curve c indicative of a voltage drop level characteristic at a source capacitance of 10 nF. It will be seen that the source inductance can be about $8 \times 10^{-8}$ H in the case of FIG. 27. Accordingly, both the maximum permissible value 60 dBμA of source current noise level and the maximum permissible value 0.3 V of voltage drop level can be satisfied at the source capacitance 10 nF and the source inductance set to $1 \times 10^{-7}$ H having room for the source current noise level. Conversely, the source inductance is first determined and thereafter the source capacitance can be determined from FIG. 27.

The manner of determining the source inductance and source capacitance described above is suited to critically satisfy the maximum permissible value of source current noise level or the maximum permissible value of voltage drop level and otherwise, the source inductance and source capacitance with more margins may be determined.

Figure 28:
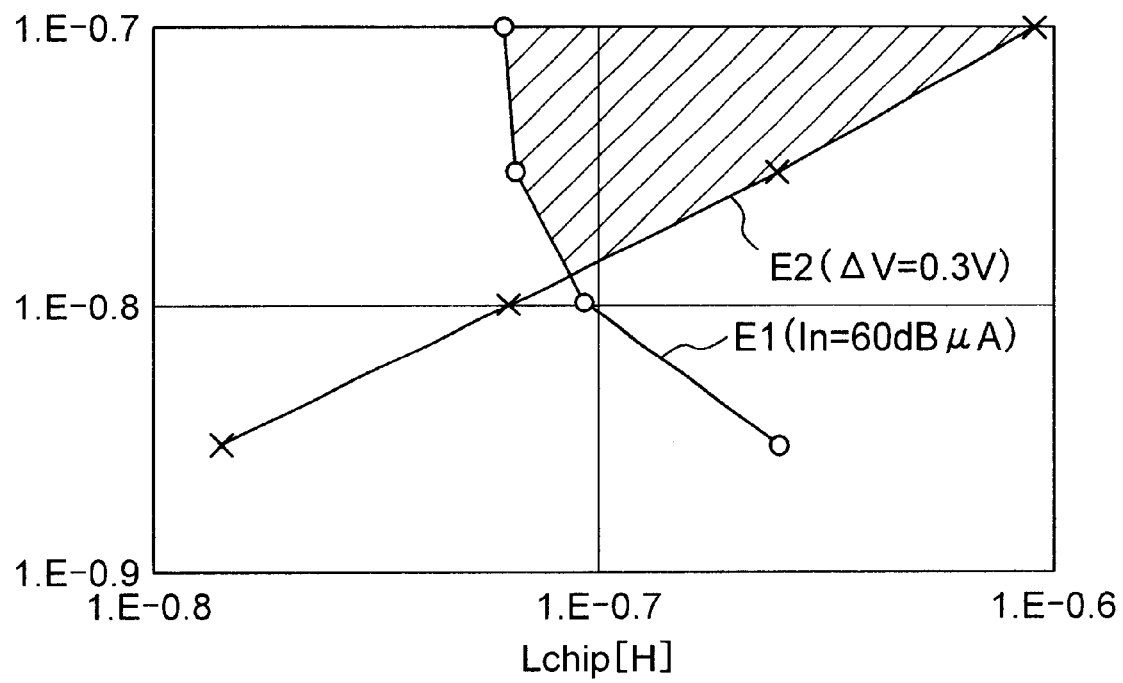
FIG. 28 is a graph showing a range in which combinations of source inductance and source capacitance that satisfy the maximum permissible value of source current noise level In and the maximum permissible value of voltage drop level ΔV in the method of the present invention.

To ensure that combinations of source inductance and capacitance satisfying the maximum permissible value of the source current noise level or the voltage drop level can be determined graphically with ease on the basis of the simulation results shown in FIG. 27, the present inventors prepare a graph as shown in FIG. 28, where abscissa represents source inductance and ordinate represents capacitance, to indicate combinations of source inductance and source capacitance satisfying the maximum permissible value (60 dBμA) of source current noise level In by ○ mark and combinations of source inductance and source capacitance satisfying the maximum permissible value (0.3 V) of voltage drop level ΔV by × mark. In this graph, a hatched region corresponds to a region of the combinations of source inductance and source capacitance satisfying both the maximum permissible value of source current noise level and the maximum permissible value of voltage drop level. By using this graph, the combinations of source inductance and source capacitance satisfying both the maximum permissible value of source current noise level and that of voltage drop level can be determined easily.

Further, the present inventors have considered to generalize the aforementioned graph and have studied inequalities representative of curve E1 connecting points plotted by ○ mark and curve E2 connecting points plotted by × mark. As a result, it has been found that the curve E1 can be approximated by the following equation (4) and the curve E2 can be approximated by the following equation (5), where Imax(ω) is the maximum permissible value of source current noise at frequency ω and ΔV is the permissible value of voltage drop level in the internal circuit.

$$\frac{\sqrt{\left(\frac{Imac(\omega)}{Imax(\omega)}\cdot\frac{VCC0}{Vchip0}\right)^2((\omega CchipRchip)^2+1)-(\omega CchipRchip)^2}+1}{\omega^2 Cchip} \quad (4)$$

$$Lboard = Lchip$$

$$Imac(\omega=0)\cdot\frac{VCC0}{Vchip0}\sqrt{\frac{Lboard+Lchip}{Cchip}}\cdot\exp\left(-\frac{G}{\sqrt{4-G^2}}\mathrm{atan}\left(\frac{(1-G^2)\sqrt{4-G^2}}{2G}\right)\right) \quad (5)$$

$$\left(\frac{2}{\sqrt{4-5G^2+6G^4-G^6}}\right)=\Delta V$$

The equation used in the process of the simulation is modified to reach the above equations. In equation (5), Imac(ω=0) means time average of Imac and in equation (4), Vchip0 means a terminal voltage across the current source 254 (Imac) in FIG. 21, which is given by Vchip0=VCC0−1 Ω×Imac(ω=0). Further, Imac(ω) can be expressed by the aforementioned equation (3) by using the frequency characteristic I0(ω) calculated through Fourier transform of the time waveform I0(t) of power supply current I0 obtained by simulation in the measuring system of FIG. 21 (the equivalent circuit of FIG. 19). In addition, G in the equation (5) is a constant expressed by G=Rchip/√{(Lboard+Lchip)/Cchip}.

Besides, these equations can be used to express a critical curve of combinations of source inductance and source capacitance satisfying the maximum permissible value of source current noise level or the maximum permissible value of voltage drop level when the maximum permissible value of source current noise level is unequal to 60 dBμA and the maximum permissible value of voltage drop level is unequal to 0.3 V.

Accordingly, the permissible range of source inductance and source capacitance hatched in FIG. 28 can be expressed by the following inequalities (6) and (7).

$$\frac{\sqrt{\left(\frac{Imac(\omega)}{Imax(\omega)}\cdot\frac{VCC0}{Vchip0}\right)^2((\omega CchipRchip)^2+1)-(\omega CchipRchip)^2}+1}{\omega^2 Cchip} - Lboard \leq Lchip \quad (6)$$

$$Imac(\omega=0)\cdot\frac{VCC0}{Vchip0}\sqrt{\frac{Lboard+Lchip}{Cchip}}\cdot\exp\left(-\frac{G}{\sqrt{4-G^2}}\mathrm{atan}\left(\frac{(1-G^2)\sqrt{4-G^2}}{2G}\right)\right) \quad (7)$$

$$\left(\frac{2}{\sqrt{4-5G^2+6G^4-G^6}}\right)\leq\Delta V$$

Accordingly, by selecting the inductance of source inductor and the source capacitance such that the above inequalities are satisfied, the inductance of source inductor and the source capacitance necessary for suppressing the source current noise to a desired value or less can be determined easily through simulation.

The invention made by the present inventors has been described specifically on the basis of the embodiments but the present invention is in no way limited to the foregoing embodiments and can obviously be altered and modified in various ways without departing from the gist of the invention. For example, the source inductor and source capacitor formed on the semiconductor chip are not limited to the specified examples indicated in the foregoing embodiments but may have different structures or may be realized with elements provided externally of the chip. Further, in the foregoing embodiments, the semiconductor integrated circuit having a plurality of source voltage terminals and a plurality of source inductors has been described but the design method for semiconductor integrated circuit according to the invention can also be applied to a semiconductor integrated circuit having a single source inductor.

What is claimed is:

1. A semiconductor integrated circuit having an inductance, comprising:

a semiconductor internal circuit having a first power supply line and a second power supply line;

first and second terminals for a first power supply fed to said semiconductor internal circuit and third and fourth terminals for a second power supply;

a first inductor connected between said first power supply line of said internal circuit and said first terminal and having a predetermined inductance;

a second inductor connected between said first power supply line of said internal circuit and said second terminal and having an inductance substantially equal to said predetermined inductance of said first inductor;

a third inductor connected between said second power supply line of said internal circuit and said third terminal and having an inductance smaller than said predetermined inductance; and a fourth inductor connected between said second power supply line of said internal circuit and said fourth terminal and having an inductance smaller than said predetermined inductance.

2. A semiconductor integrated circuit according to claim 1, wherein said first inductor makes a loop around said internal circuit by at least ¾ turns and said second inductor makes a loop around said internal circuit by at least ¾ turns in the same direction as the looping direction of said first inductor.

3. A semiconductor integrated circuit according to claim 1, wherein each of said first and second inductors takes a U-shape form around said internal circuit.

4. A semiconductor integrated circuit according to claim 3, wherein said first and second inductors have portions, respectively, that are adjacent and parallel with each other around said internal circuit.

5. A semiconductor integrated circuit according to claim 1, wherein each of said first and second inductors has a conductor connected thereto by way of a plurality of through-holes passing through an insulating layer to overlap each of said first and second inductors.

6. A semiconductor integrated circuit according to claim 1, wherein when the source resistance existing between said first and second power supply lines is Rchip, the source capacitance is Cchip, the voltage of an external power supply connected to said first terminal is VCC0 and the source voltage applied to a semiconductor chip is Vchip and then when the sum of currents flowing in the semiconductor chip is Imac, the time average of Imac is Imac(ω=0), the maximum permissible value of source current noise level In at frequency ω is Imax(ω) and the permissible value of drop level of voltage V of the internal circuit is ΔV, the inductance of said inductor and the capacitance of the source capacitor are so selected as to satisfy the following two inequalities:

$$\frac{\sqrt{\left(\frac{Imac(\omega)}{Imax(\omega)} \cdot \frac{VCC0}{Vchip0}\right)^2 ((\omega CchipRchip)^2 + 1) - (\omega CchipRchip)^2 + 1}}{\omega^2 Cchip} - Lboard \le Lchip$$

$$LchipImac(\omega = 0) \cdot \frac{VCC0}{Vchip0} \sqrt{\frac{Lboard + Lchip}{Cchip}} \cdot \exp$$

$$\left(-\frac{G}{\sqrt{4-G^2}} \operatorname{atan}\left(\frac{(1-G^2)\sqrt{4-G^2}}{2G}\right)\right)\left(\frac{2}{\sqrt{4-5G^2+6G^4-G^6}}\right) \le \Delta V$$

where Imac(t=0) means Imac(ω,t=0) and G=Rchip/√{(Lboard+Lchip)/Cchip} stands.

7. A semiconductor integrated circuit comprising:

a plurality of first power supply pads;

a plurality of second power supply pads;

a first power supply line for supplying a first power supply voltage applied to said plurality of first power supply pads to an internal circuit;

a second power supply line for supplying a second power supply voltage applied to said plurality of second power supply pads to said internal circuit; and a plurality of inductors each connected between each of said plurality of first power supply pads and said first power supply line and each arranged to make a loop around said internal circuit so that said plurality of inductors have mutually substantially equal impedances reaching nodes at which said internal circuit connects to said first power supply line;

wherein wiring conductors constituting said plurality of inductors are each formed to make a loop around a semiconductor chip and are connected between corresponding power supply pads and said first power supply line such that currents flow through said individual wiring conductors in the same direction; and wherein the wiring conductor constituting each of said inductors is formed to make a loop by ¾ or more turns around an area in which said internal circuit of the semiconductor chip is formed.

8. A semiconductor integrated circuit comprising:

a plurality of first power supply pads;

a plurality of second power supply pads;

a first power supply line for supplying a first power supply voltage applied to said plurality of first power supply pads to an internal circuit;

a second power supply line for supplying a second power supply voltage applied to said plurality of second power supply pads to said internal circuit; and a plurality of inductors each connected between each of said plurality of first power supply pads and said first power supply line and each arranged to make a loop around said internal circuit so that said plurality of inductors may have mutually substantially equal impedances reaching nodes at which said internal circuit connects to said first power supply line;

wherein a wiring layer constituting said first power supply line serves as one electrode of a capacitor and a conductive layer serving as the other electrode of the capacitor is formed to oppose the one electrode through an insulating film;

wherein said insulating film between the one electrode and the other electrode is provided with a conductive layer formed separately from the conductive layers constituting these electrodes to decrease the distance between the one electrode and the other electrode; and wherein said insulating film between the one electrode and the other electrode is provided with a conductive layer formed separately from the conductive layers constituting these electrodes and having irregularities to decrease the distance between the one electrode and the other electrode and increase a substantial opposing area.

9. A semiconductor integrated circuit according to claim 8, wherein when the source resistance existing between said first and second power supply lines is Rchip, the source capacitance is Cchip, the voltage of an external power supply connected to said plurality of first power supply pads is VCC0 and the source voltage applied to the semiconductor chip is Vchip, and when the sum of currents flowing in the semiconductor chip is Imac, the time average of Imac is Imac(ω=0), the maximum permissible value of source current noise level In at frequency ω is Imax(ω) and the permissible value of drop level of voltage V of the internal circuit is ΔV, the inductance of each of said inductors and the capacitance of said source capacitance are so selected as to satisfy the following two inequalities:

$$\frac{\sqrt{\left(\frac{Imac(\omega)}{Imax(\omega)} \cdot \frac{VCC0}{Vchip0}\right)^2 ((\omega CchipRchip)^2 + 1) - (\omega CchipRchip)^2 + 1}}{\omega^2 Cchip} - Lboard \leq Lchip$$

$$LchipImac(\omega = 0) \cdot \frac{VCC0}{Vchip0} \sqrt{\frac{Lboard + Lchip}{Cchip}} \cdot \exp\left(-\frac{G}{\sqrt{4-G^2}} \operatorname{atan}\left(\frac{(1-G^2)\sqrt{4-G^2}}{2G}\right)\right)\left(\frac{2}{\sqrt{4-5G^2+6G^4-G^6}}\right) \leq \Delta V$$

$G = Rchip/\sqrt{(Lboard+Lchip)/Cchip}$ stands.

* * * * *